US009581660B2

(12) United States Patent
Ausserlechner

(10) Patent No.: US 9,581,660 B2
(45) Date of Patent: *Feb. 28, 2017

(54) ELECTRONIC DEVICE COMPRISING HALL EFFECT REGION WITH THREE CONTACTS

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 167 days.

This patent is subject to a terminal disclaimer.

(21) Appl. No.: 14/539,503

(22) Filed: Nov. 12, 2014

(65) Prior Publication Data

US 2015/0070009 A1    Mar. 12, 2015

Related U.S. Application Data

(63) Continuation of application No. 13/298,917, filed on Nov. 17, 2011, now Pat. No. 8,922,207.

(51) Int. Cl.
*G01R 33/07* (2006.01)
*H01L 43/06* (2006.01)
*G01L 1/12* (2006.01)

(52) U.S. Cl.
CPC ............... *G01R 33/072* (2013.01); *G01L 1/12* (2013.01); *G01R 33/07* (2013.01); *G01R 33/077* (2013.01); *H01L 43/065* (2013.01)

(58) Field of Classification Search
CPC ............................... G01R 33/07; G01R 33/075

(Continued)

(56) References Cited

U.S. PATENT DOCUMENTS 4,829,352 A    5/1989  Popovic et al.
6,127,821 A   10/2000  Ramsden et al.
(Continued)

FOREIGN PATENT DOCUMENTS

DE          10150955 C1     6/2003
DE       102009015965 A1   10/2009
(Continued)

OTHER PUBLICATIONS

Notice of Allowance Dated Apr. 25, 2016 U.S. Appl. No. 14/273,807.

(Continued)

*Primary Examiner* — Reena Aurora
(74) *Attorney, Agent, or Firm* — Eschweiler & Potashnik, LLC

(57) ABSTRACT

An electronic device is disclosed as a part of a magnetic field sensor or a mechanical stress sensor. The electronic device includes a Hall effect region, a first contact (temporarily functioning as a first supply contact), a second contact (second supply contact), and a third contact (temporarily functioning as a first sense contact) that are arranged in or on a surface of the Hall effect region. The first contact and the third contact are arranged in a substantially symmetrical manner to each other with respect to the second contact. An electrical current distribution within the Hall effect region is influenced by a physical quantity (e.g. magnetic field strength or mechanical stress) to be measured. A sense signal tapped at the third contact is a function of the current distribution, the sense signal thus being indicative of the physical quantity. A corresponding sensing method using the electronic device is also disclosed.

24 Claims, 25 Drawing Sheets

(58) Field of Classification Search
USPC .............................................. 324/251, 207.2
See application file for complete search history.

(56) References Cited

U.S. PATENT DOCUMENTS

| | | |
|---|---|---|
| 6,184,679 B1 | 2/2001 | Popovic et al. |
| 7,782,050 B2 | 8/2010 | Ausserlechner et al. |
| 7,872,322 B2 | 1/2011 | Schott et al. |
| 8,922,207 B2 | 12/2014 | Ausserlechner |
| 2007/0290682 A1 | 12/2007 | Oohira et al. |
| 2010/0123458 A1 | 5/2010 | Schott |
| 2010/0133632 A1 | 6/2010 | Schott |
| 2010/0219810 A1 | 9/2010 | Rocznik et al. |
| 2010/0219821 A1 | 9/2010 | Rocznik et al. |
| 2012/0016614 A1 | 1/2012 | Hohe et al. |
| 2013/0015853 A1 | 1/2013 | Raz et al. |
| 2013/0021026 A1 | 1/2013 | Ausserlechner |
| 2013/0127453 A1 | 5/2013 | Ausserlechner |
| 2013/0214775 A1 | 8/2013 | Ausserlechner et al. |
| 2013/0342194 A1 | 12/2013 | Motz et al. |
| 2014/0210461 A1 | 7/2014 | Ausserlechner |
| 2015/0323613 A1 | 11/2015 | Ausserlechner |

FOREIGN PATENT DOCUMENTS

| | | |
|---|---|---|
| DE | 102012212606 A1 | 1/2013 |
| EP | 0143875 A1 | 6/1985 |
| EP | 2071347 A2 | 6/2009 |
| EP | 2192417 A2 | 6/2010 |
| EP | 2546670 A2 | 1/2013 |
| WO | 03036733 A2 | 5/2003 |
| WO | 2004025742 A1 | 3/2004 |

OTHER PUBLICATIONS

Notice of Allowance Dated Dec. 18, 2015 U.S. Appl. No. 14/273,771.
Siya V. Lozanova, et al.; Parallel-Field Hall Effect Microsensors with Minimal Design Complexity, In: IEEE Sensors Journal, vol. 9, 2009, No. 7 S. 761-766.
Ch. Roumenin, et al.; 3-D Silicon Vector Sensor Based on a Novel Parallel-Field Hall Microdevices. In: Sensors and Actuators A, Bd. 110, 2004, S. 219-227.
English Translation of Chinese Office Action dated Jul. 11, 2014 for co-pending Chinese Application No. 201210467043.1.
Notice of Allowance dated Aug. 15, 2014 in connection with U.S. Appl. No. 13/298,917.
Vertical Hall device with conductive opposite face node for electrically connecting first and second Hall effect regions 149 pages, U.S. Appl. No. 13/753,195, filed Jan. 21, 2014,
U.S. Appl. No. 14/273,771, filed May 9, 2014, Vertical Hall effect device 46 pages.
R.S. Popovic, "Hall Device for Magnetic Sensor Microsystems"; IEEE 1997 International Conference on Solid-State Sensors and Actuators, 1997, p. 1-4.
*Ex Parte Quayle* Dated Jan. 21, 2016 U.S. Appl. No. 14/273,807.

plan view:
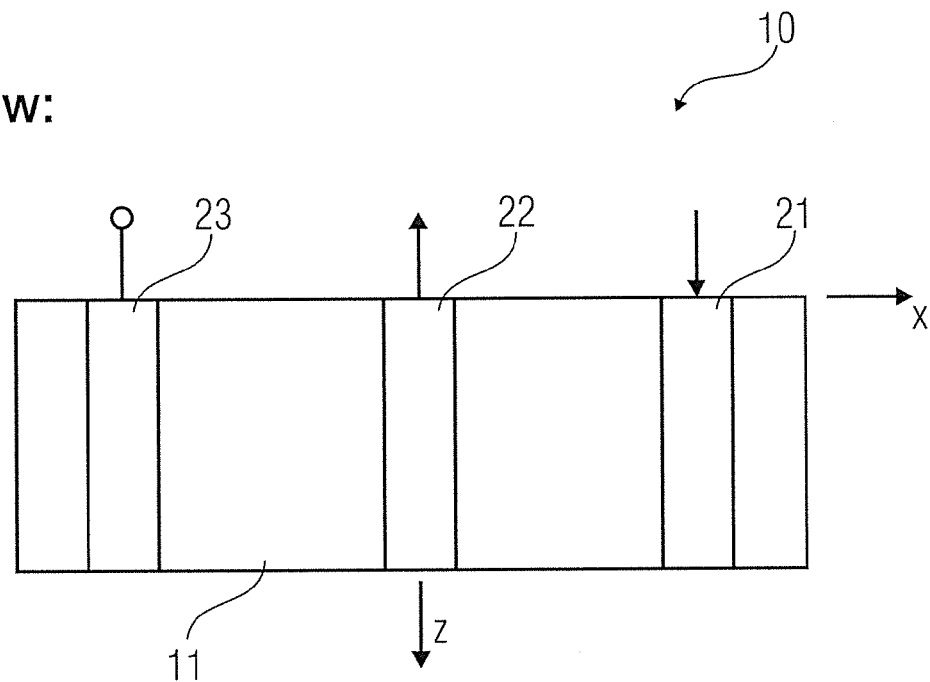
cross section:
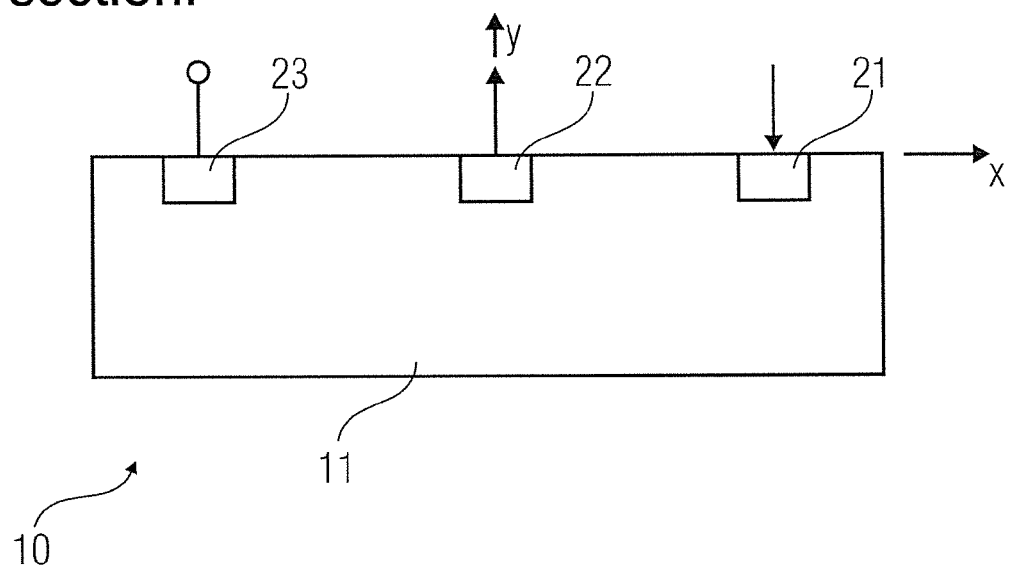
FIG 1A

1st CLOCK PHASE cross section

2ⁿᵈ CLOCK PHASE cross section cross section cross section

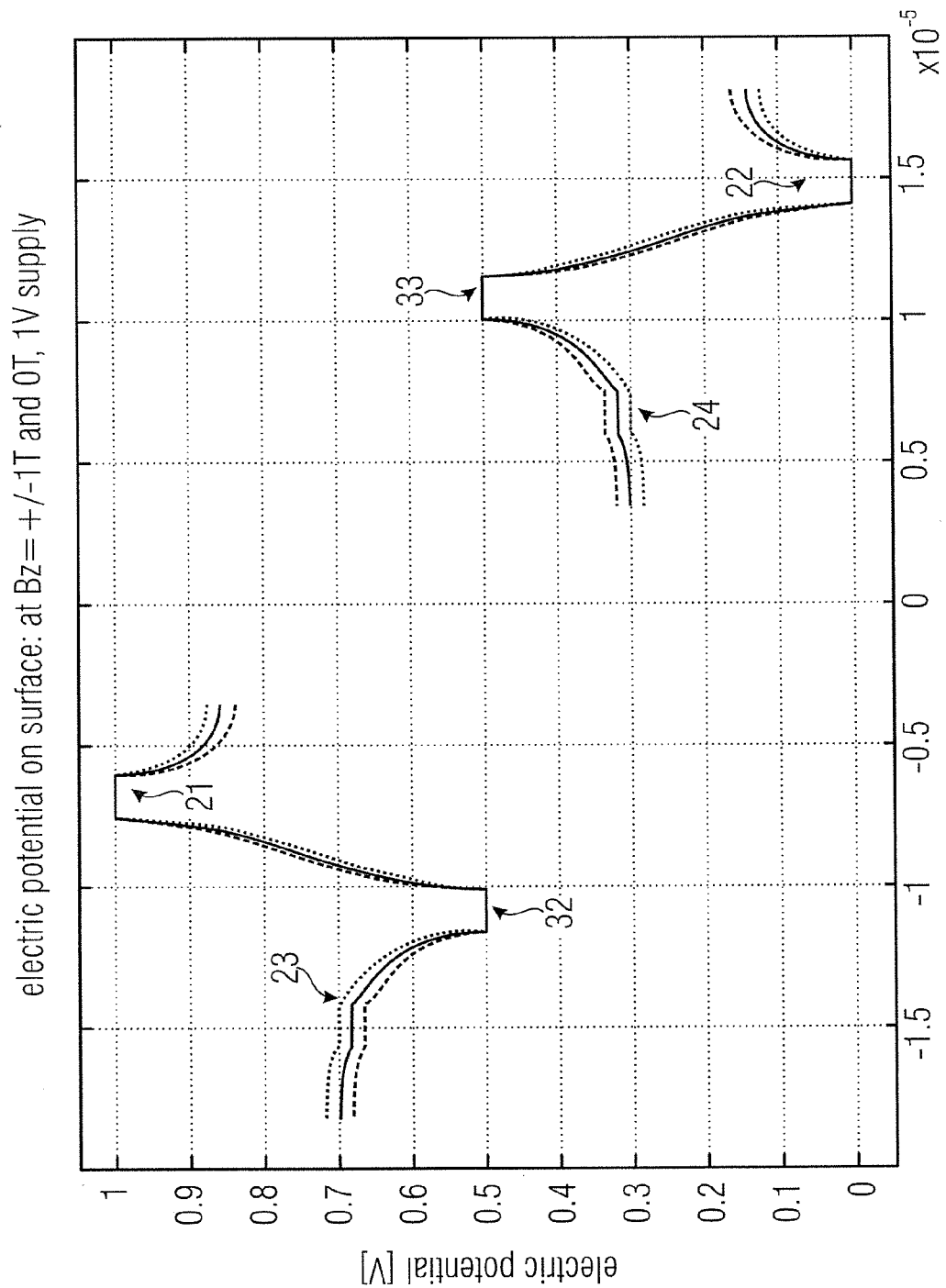

plan view plan view plan view plan view:

plan view:

ELECTRONIC DEVICE COMPRISING HALL EFFECT REGION WITH THREE CONTACTS

CROSS REFERENCE TO RELATED APPLICATIONS

This application is a Divisional Patent Application claiming priority to U.S. patent application Ser. No. 13/298,917 filed Nov. 17, 2011 in the name of Udo Ausserlechner entitled "Electronic Device Comprising Hall Effect Region with Three Contacts" and is hereby incorporated in its entirety.

FIELD

Embodiments of the present invention relate to an electronic device and to a sensing method. In particular, the electronic device may be a sensing device for sensing a physical quantity, such as a magnetic field or a mechanical stress within an object.

BACKGROUND

Electronic devices may be used to sense or measure physical quantities. In order to sense or measure the strength and direction of a magnetic field parallel to the surface of, e.g., a semiconductor die, vertical Hall devices may be used. Most vertical Hall devices suffer from the fact that the spinning current method, that is used to cancel the zero-point error of the Hall devices, does not work very well. With known methods of the spinning current scheme it is possible to obtain residual zero point errors of about 1 mT. A reason for this rather poor offset behavior can be found in the asymmetry of the vertical Hall device. Although it is known how to connect four vertical Hall devices in order to improve the symmetry, the contact resistances still cause residual asymmetries.

Another physical quantity that may be sensed or measured is mechanical stress within an object such as a substrate, in particular a semiconductor substrate. To this end, an electronic device may be used that has a similar structure as a Hall device. Indeed, it may suffice to slightly modify some internal connections of a suitable Hall device in order to obtain a mechanical stress sensor.

SUMMARY

Embodiments of the present invention provide an electronic device comprising a Hall effect region, a first contact arranged in or on a surface of the Hall effect region, a second contact arranged in or on the surface of the Hall effect region, and a third contact arranged in or on the surface of the Hall effect region. The first contact is configured to function at least temporarily as a first supply contact for the Hall effect region. The second contact is a second supply contact for the Hall effect region. The third contact is configured to function at least temporarily as a sense contact. The first contact and the third contact are arranged in a substantially symmetrical manner to each other with respect to the second contact, and wherein an electrical current distribution within the Hall effect region is influenced by a physical quantity to be measured and wherein a sense signal tapped at the third contact is a function of the current distribution, the sense signal thus being indicative of the physical quantity.

Further embodiments of the present invention provide an electronic device comprising a Hall effect region, a first contact, a second contact, and a third contact. The first contact, the second contact, and the third contact are arranged in or on a surface of the Hall effect region. The first contact is configured to at least temporarily function as a supply contact. The second contact is configured to function as a further supply contact. The third contact is configured to at least temporarily function as a sense contact, the third contact being at a first distance from the first contact and at a second distance from the second contact. A distance between the first contact and the second contact is smaller than a maximum of the first distance and the second distance. An electrical current distribution within the Hall effect region is influenced by a physical quantity to be measured and wherein a sense signal tapped at the third contact is a function of the current distribution, the sense signal thus being indicative of the physical quantity.

Further embodiments of the present invention provide a sensing method according to which an electric current is fed to a Hall effect region via a first contact arranged in or on a surface of a Hall effect region and withdrawn from the Hall effect region via a second contact arranged in or on the surface of the Hall effect region. The method also comprises sensing a sense signal at a third contact formed in or on the surface of the Hall effect region, wherein the first contact and the third contact are arranged in a substantially symmetrical manner to each other with respect to the second contact. An electrical current distribution within the Hall effect region is influenced by a physical quantity to be measured. A sense signal tapped at the third contact is a function of the current distribution, the sense signal thus being indicative of the physical quantity. The method further comprises feeding the electric current or a further electric current to the Hall effect region via the third contact and withdrawing the electric current or the further electric current via the second contact, or vice versa (i.e., feeding the electric current via the second contact and withdrawing via the third contact). The method further comprises sensing a further sense signal at the first contact and determining an output signal on the basis of the sense signal and the further sense signal.

Further embodiments of the present invention provide a sensing method which comprises feeding an electric current to a Hall effect region via a first contact arranged in or on a surface of a Hall effect region and withdrawing the electric current from the Hall effect region via a second contact arranged in or on the surface of the Hall effect region. The sensing method also comprises sensing a sense signal at a third contact formed in or on the surface of the Hall effect region, wherein the third contact is at a first distance from the first contact and at a second distance from the second contact. A distance between the first contact and the second contact is smaller than a maximum of the first distance and the second distance. An electrical current distribution within the Hall effect region is influenced by a physical quantity to be measured and a sense signal tapped at the third contact is a function of the current distribution, the sense signal thus being indicative of the physical quantity. The sensing method further comprises feeding the electric current or a further electric current to the Hall effect region via the third contact and withdrawing the electric current or the further electric current via the second contact, or vice versa. The sensing method further comprises sensing a further sense signal at the first contact and determining an output signal on the basis of the sense signal and the further sense signal.

BRIEF DESCRIPTION OF THE DRAWINGS

Embodiments of the present invention are described herein, making reference to the appended drawings.

FIG. 1A shows a schematic plan view of an electronic device and a corresponding cross section of the electronic device according to an embodiment of the teachings disclosed herein;

FIG. 7 shows a graph illustrating, for three different magnetic field values, the electrical potential at a surface of the two Hall effect regions of the electronic device according to the embodiment shown in FIG. 1A and corresponding to the cross-sectional view of the electrical potential shown in FIG. 4A;

Figure 1B:
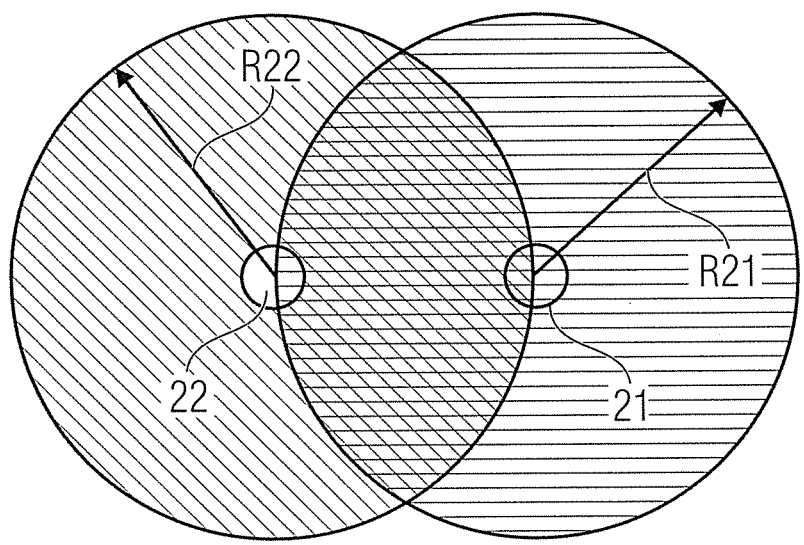
FIG. 1B graphically illustrates conditions for distances between three contacts of the Hall effect region relevant to some embodiments of the teachings disclosed herein.

Equal or equivalent elements or elements with equal or equivalent functionality are denoted in the following description by equal or similar reference signs.

DETAILED DESCRIPTION

In the following description, a plurality of details are set forth to provide a more thorough explanation of embodiments of the teachings disclosed herein. However, it will be apparent to one skilled in the art that embodiments of the teachings disclosed herein may be practiced without these specific details. Features of the different embodiments described hereinafter may be combined with each other, unless specifically noted otherwise. For the most part, the terms "Hall effect region" and "tub" are used interchangeably herein. Accordingly, a Hall effect region may be a tub or well of a first conductivity type that is embedded in a substrate or a tub of opposite conductivity type. This structure may cause an electrical isolation of the tub against the substrate in particular if the resulting pn-junction is reverse biased. However, it may also be possible that one tub comprises two or more Hall effect regions, in particular when two or more relatively distinct current flows can be created within the Hall effect region (thus effectively providing some sort of isolation of the two Hall effect regions).

When the electronic device comprises two or more Hall effect regions, these may be isolated from each other. The electrical isolation of two Hall effect regions against each other may take several forms. According to a first form of isolation, the two or more Hall effect regions are disjoined from each other, i.e., two adjacent Hall effect regions do not merge at one or more locations but are separated by a material other than the Hall effect region material. As one possible option, the tub may be isolated in a lateral direction by means of trenches that are typically lined and/or filled with a thin oxide. As another option, the tub may be isolated towards the bottom by means of an SOI (silicon on insulator) structure. Although the tub typically has a single conductivity type it may be advantageous to configure the doping concentration in an inhomogeneous manner, i.e. spatially variable. In this manner a high concentration of the doping agent may occur in the area of the contacts, as is usual with deep CMOS tub contacts. In the alternative, a layering of differently strongly doped layers may be sought after, as is the case with e.g. a buried layer. Such a layering may result, to some extent, from technological reasons relative to other electronic structures that are formed within the substrate. The design of the electronic device, the Hall device, or the mechanical stress sensor then may need to be reconciled with these circumstances, even though the layering might, in fact, be unfavorable for the electronic device, the Hall device, or the mechanical stress sensor.

In one embodiment, the Hall effect region may be an n-doped semiconductor as this provides about a three times higher mobility and consequently a higher Hall factor than with a p-doped semiconductor. The doping concentration in the functional part of the Hall effect region is typically in the range of $10^{15}$ cm$^{-3}$ to $10^{17}$ cm$^{-3}$, in one example.

Another possible material for the Hall effect regions is permalloy which is a nickel-iron magnetic alloy, or a material similar to permalloy. Permalloy exhibits a low coercivity, near zero magnetostriction, high magnetic permeability, and significant anisotropic magnetoresistance. A variation of the electrical resistance of permalloy within a range of approximately 5% can typically be observed depending on the strength and the direction of an applied magnetic field. This effect may be used in a similar manner as the Hall effect occurring in a semiconductor for sensing and/or measuring a magnetic field, and is known in the literature as anomalous Hall effect.

The teachings disclosed herein may be used in connection with a spinning current principle, in which supply- and sense-terminals are exchanged in consecutive clock phases/operating phases. Hence, the supply/sense contacts are configured to alternately function as a momentary supply contact and a momentary sense contact, i.e., to function as momentary supply/sense contacts in an alternating manner. A sense terminal in a vertical Hall device responds to an electric current passing by. A magnetic field (parallel to the die surface and perpendicular to the current streamlines) can efficiently lift up or pull down the potential at the contact (which typically is at the surface of the die). The term "vertical Hall effect" or "vertical Hall device" may be thought of as being derived from the fact that the Hall effect in a vertical Hall device acts in a vertical direction (if the surface of the substrate is assumed to be horizontal, per definition). Besides a classification of Hall devices in "horizontal Hall devices" and "vertical Hall devices" they may also be distinguished regarding the direction in which the current flows in a region where it experiences the Hall effect. In a Hall device using the "vertical current mode", the electric current substantially flows in a vertical direction with respect to the surface (which is assumed to be horizontal). In a Hall device using the "horizontal current mode", the electric current substantially flows in a horizontal direction, i.e., parallel to the (horizontal) substrate surface, at least in a region where the Hall effect acts on the electric current and can be sensed.

The Hall effect regions are formed in an isolated manner from each other (for example in the same substrate, having an insulating structure or at least a substantially current-free region between them, or in two distinct substrates) but galvanically connected in a series connection. An electric current enters the series connection at a first supply contact and leaves the series connection at a second supply contact.

In some configurations a conductive region, such as an n+ buried layer (nBL), may be present adjacent to a second surface of the Hall effect regions opposite to the first surface. According to the teachings disclosed herein, the contacts that are formed in the first surface(s) or on the first surface(s) of the Hall effect region(s) are electrically separated from the conductive region. In particular, no low-ohmic connection, such as one or more n+ sinker(s), exists between one of the at least six contacts and the conductive region (e.g., the nBL). Rather, the contacts and the conductive region are separated by at least a portion of the relatively high-ohmic Hall effect region. In other words, an electrical connection between one of the at least six contacts and the conductive region traverses the corresponding Hall effect region or a portion thereof (typically in a vertical direction).

FIG. 1A shows a schematic plan view and a schematic cross section of an electronic device 10 according to an embodiment of the teachings disclosed herein. The electronic device 10 comprises a Hall effect region 11 and three contacts 21, 22, 23 arranged at a surface of the Hall effect region 11. A first contact 21 is configured to function, at least temporarily, as a supply contact. Hence, an electrical current to be fed to the Hall effect region 11 flows via the first contact 21 into the Hall effect region 11. A second contact 22 is configured to function as a further supply contact so that the electrical current leaves the Hall effect region 11 via the second contact 22. Note that the direction of the electrical current may be inversed so that the electrical current flows into the Hall effect region 11 via the further supply contact (second contact) 22 and leaves the same via the supply contact (first contact) 21. A third contact 23 is configured to function, at least temporarily, as a sense contact.

During an operation of the electronic device 10 the electrical current flows from the first contact 21 to the second contact 22, or vice versa, and causes a current distribution within the Hall effect region 11. The current distribution may be influenced by a physical quantity, such as a magnetic field or a mechanical stress within the Hall effect region. A sense signal tapped at the third contact 23 is influenced by the varying current distribution and thus also by the physical quantity.

FIG. 1A shows the electronic device in a first possible configuration in which the first contact 21 is the supply contact and the third contact 23 is the sense contact. In a second possible configuration the first contact 21 may function as a sense contact and the third contact 23 may function as a supply contact. The first and second possible configurations may be used in an alternating manner so that a spinning current scheme is obtained.

The first contact 21 and the third contact 23 are arranged in a substantially symmetrical manner to each other with respect to the second contact 22 (i.e., when taking the second contact 22 as a center of symmetry). In other words, the second contact, that functions as the permanent supply contact, is in the symmetry center of the first and third contacts 21, 23, i.e., a corresponding symmetry axis extends through the second contact 22 in the y-z-plane. The first contact 21 is at a first side of the symmetry axis and the third contact 23 is at an opposite second side of the symmetry axis.

In the embodiment shown in FIG. 1A the distance between the first contact 21 and the second contact 22 is substantially equal to the distance between the second contact 22 and the third contact 23. Moreover, the distance between the supply contact 21 and the further supply contact 22 is smaller than the distance between the supply contact 21 and the sense contact 23. The three contacts 21, 22, and 23 need not be arranged along a straight line as illustrated in FIG. 1A, but may rather be arranged in many other ways, such as in a triangle or along an arc.

The expression "substantially symmetrical" means that a dimension may deviate from a perfectly symmetrical value within a tolerance range (for example, due to manufacturing tolerances on the order of 1%, 5%, or 10%) and still be considered to be symmetrical. In general, the expression "substantially" used in various contexts herein shall be understood as comprising a tolerance range around a crisp value.

FIG. 1B graphically illustrates the conditions for the first distance and the second distance which are relevant for at least some embodiments of the teachings disclosed herein. As a reminder, the first distance is the distance between the first contact 21 and the third contact 23. The second distance is the distance between the second contact 22 and the third contact 23. The third contact 23 is the (momentary) sense contact and is farther away from at least one of the two supply contacts than a distance between the two supply contacts 21, 22. A circle around the first contact 21 having a radius R21 indicates a region in which the third contact 23 would be closer to the first contact 21 than the second contact 22. Another circle around the second contact 22 having a radius R22 indicates a region in which the third contact 23 would be closer to the second contact 22 than the first contact 21. The condition for the distances of the three contacts 21, 22, 23 is that the third contact 23 is farther away from at least one of the first contact 21 and the second contact 22 than the distance between the first and second contacts 21, 22. This condition is not met in the intersection of the two circles with the radiuses R21 and R22.

The proposed arrangement of the two supply contacts being substantially next to each other, while the sense contact is arranged aside from the two supply contacts, is a departure from existing design principles for Hall devices, where the sense contact(s) is/are typically arranged between the two (or more) supply contacts. The teachings disclosed herein are based on the insight that the sense contact does not need to be actually "between" the supply contacts (i.e., close to the shortest current stream line between the two supply contacts), but that a useful sense signal may also be obtained at a sense contact that is aside from two supply contacts placed next to each other. This arrangement of contacts opens a new possibility to make a spinning current scheme with clock phases with much better symmetry than in the prior art, as will be explained below.

In practice, the output signal of the electronic device 10 is typically subject to a relatively large zero point error. It is possible to swap functions of the first supply contact and the sense contact during a second operating phase (clock phase). In theory, the zero point errors observed in both operating phases cancel each other out. However, this typically does not work that well in practice, as a huge signal has to be sampled during each operating phase of which only a small portion contains the magnetic field information (only about $\frac{1}{1000}^{th}$) so that the sample step does not work properly for small errors in the sampling process. Therefore at least two devices (and hence two Hall effect regions) are used in practice. In this manner the difference of both sense signals of both Hall effect regions or wells may be evaluated per operating phase and thus the huge common mode signal may be circumvented. This will be explained in connection with some of the following figures, for example FIG. 10.

Figure 2:
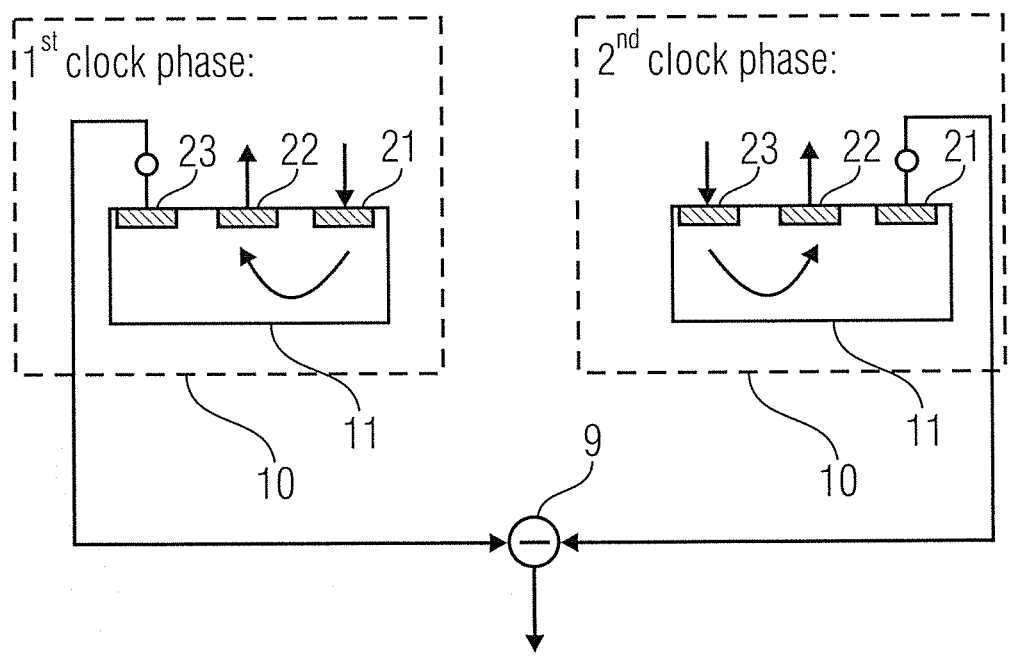
FIG. 2 illustrates how the electronic device shown in FIG. 1 can be used in a spinning current scheme.

FIG. 2 shows the electronic device 10 during a first clock phase of a spinning current cycle and during a second clock phase of the spinning current cycle. The electronic device 10 comprises the Hall effect region 11 with three contacts 21, 22, 23, wherein the two outer contacts 21, 23 are located symmetrically with respect to the middle contact 22. The middle contact 22 is a supply contact through which substantially the entire electrical current flows into or out of the Hall effect region 11. The two other contacts 21, 23 are a momentary supply contact and a momentary sense contact, respectively, and are exchanged (regarding their functions) in different operating modes and/or clock cycles. Hence, the first contact 21 functions as a momentary sense contact during the second clock phase and the third contact 23 functions as a momentary supply contact during the second clock phase.

The electronic device 10 shown in FIG. 2 may be operated by subtracting the sense signals tapped or sampled at the momentary sense contacts during the first and second clock phases in order to measure a magnetic field. The subtraction may be performed by means of a subtraction element 9. In contrast, adding the two sense signals yields an output signal that is indicative of a mechanical stress within the Hall effect region 11.

Figure 3A:
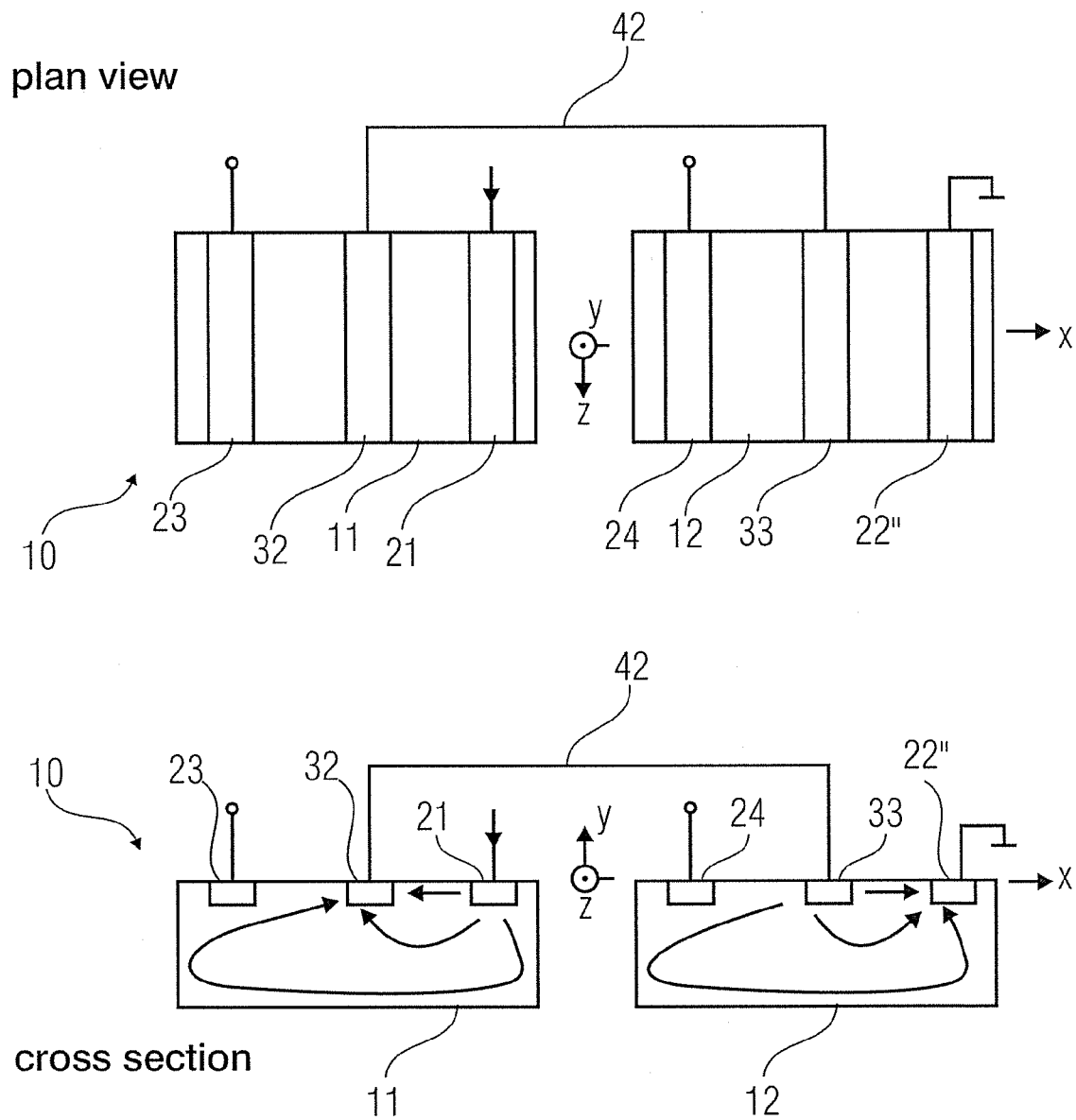
FIG. 3A shows a schematic plan view of an electronic device and a corresponding cross section of the electronic device according to an embodiment of the teachings disclosed herein during a first phase of a measuring cycle.

FIG. 3A shows a schematic plan view of an electronic device 10 according to an embodiment of the teachings disclosed herein and, below the schematic plan view, a schematic cross section of the same electronic device. The electronic device 10 comprises a first Hall effect region 11 and a second Hall effect region 12. The Hall effect regions 11 and 12 may be formed in a semiconductor substrate by locally doping the semiconductor to obtain e.g. an n-type semiconductor material (an n-type semiconductor has more electrons than holes). A momentary supply contact 21 and a momentary sense contact 23 are formed on a surface of the first Hall effect region 11. A momentary supply contact 22 and a momentary sense contact 24 are also formed on a surface of the second Hall effect region 12. The supply contacts 21, 22 and the sense contacts 23, 24 are spinning current contacts that are configured to function as supply contacts during a first operating phase of a spinning current cycle and to function as sense contacts during a second operating phase of the spinning current cycle, or vice versa. The momentary supply contact 21 and the momentary sense contact 23 at the first Hall effect region 11 form a first pair of contacts. The momentary supply contact 22 and the momentary sense contact 24 at the second Hall effect region 12 form a second pair of contacts. FIG. 3A depicts the electronic device 10 in a configuration corresponding to a first clock phase of the spinning current cycle. An electrical current enters the first Hall effect region 11 at the spinning current contact 21 (first momentary supply contact) and leaves the second Hall effect region 12 at the spinning current contact 22 (second momentary supply contact) that is, in the depicted configuration, connected to a ground potential. The two spinning current contacts 23 and 24 are configured to function as momentary sense contacts during the first clock phase. In a second clock phase shown in FIG. 3B, the two spinning current contacts (former sense contacts) 23 and 24 are configured to function as momentary supply contacts and the former supply contacts 21 and 22 are configured to function as momentary sense contacts. It is typically advantageous to have a high degree of symmetry between contacts 21 and 23 as well as between contacts 22 and 24.

The electronic device 10 shown in FIG. 3A further comprises two interconnection contacts 32, 33. The interconnection contacts 32 and 33 are electrically connected to each other by means of an electrically conducting connection 42. The interconnection contacts are distinct from the spinning current contacts. In FIG. 3A, the interconnection contact 32 is spatially located between the spinning current contacts 23 and 21, i.e., between the contacts of the first pair. The second interconnection contact 33 is spatially located between the spinning current contacts 24 and 22 (between the second pair of contacts). During the first clock phase the electrical current input at the spinning current contact 21 flows along a current path involving the first Hall effect region 11 and the second Hall effect region 12 until it leaves the second Hall effect region 12 at the spinning current contact 22. The first Hall effect region 11 and the second Hall effect region 12 form a series connection between the first momentary supply contact 21 and the second momentary supply contact 22. Note that the first and second momentary sense contacts 23 and 24 are typically connected to high-ohmic sense circuitry so that substantially no electrical current or only a negligible electrical current enters or leaves the two Hall effect regions 11, 12 via the momentary sense contacts 23, 24. The conducting path for the electrical current is indicated in the schematic cross section of FIG. 3A. The conducting path leads from the supply contact 21 to the left and a portion of the electrical current passes beneath (and possibly partly through) the first momentary sense contact 23. The conducting path continues via the interconnection contacts 32 and 33 and the connection 42 to the second Hall effect region 12. Within the second Hall effect region 12 a portion of the electrical current flows directly to the right in the direction of the second momentary supply contact 22. However, another portion of the electrical current first flows to the left, passes beneath (and possibly partly through) the second momentary sense contact 24, turns around to flow to the right and leaves the second Hall effect region 12 via the second momentary supply contact 22.

As mentioned above, the electrical current flows through two Hall effect regions 11, 12 which are connected in series via the connection 42. In this manner, two devices can be operated using the same electrical current, which increases the signal-to-noise (SNR) ratio at fixed current consumption. At first glance, one could think about designing a single device having a doubled interior resistance. While this is basically true, it is typically not that easy to achieve (maybe even close to impossible) when a vertical Hall probe is involved, because the depth of the well would have to be scaled which might not always be possible due to manufacturing process-related reasons.

The connection 42 may be or comprise a wire, a conductive trace, a strip line, an electronic device such as a conducting MOS transistor (MOS: metal-oxide-semiconductor), a resistor, a diode, a more complex circuit (e.g. a controlled current source) or another means for conducting an electrical current from the first Hall effect region to the second Hall effect region. Other connections between two or more Hall effect regions which will be described below may also be or comprise a wire, a conductive trace, a strip line, an electronic device such as a transistor, or another means for conducting electrical current.

The interconnection contacts 32, 33 may be relatively large in order to make the connection relatively low-ohmic and to reduce the voltage drop across the interconnection contacts 32, 33. At least one of the interconnection contacts 32, 33 may have a large effective surface for a low-ohmic connection between the interconnection contact and the corresponding Hall effect region.

The first momentary supply contact 21 at which the electrical current enters the Hall effect regions 11, 12 is provided at the first Hall effect region 11, while the second momentary supply contact at which the electrical current leaves the Hall effect regions 11, 12 is provided at the second Hall effect region 12. The direction in which the current flows through the semiconductor Hall effect device regions 11, 12, where it enters, and where it leaves the electronic device is basically a design option and may be modified. Moreover, the direction of the current could be inversed, e.g. during an optional third operating phase and an optional fourth operating phase of the spinning current scheme. As can be seen in the schematic cross-sectional view of FIG. 3A, the electrical current passes in opposite directions beneath the momentary sense contacts 23 and 24 of the first and second Hall effect regions, respectively, so that, due to the Hall effect, the electrical potential at one of the momentary sense contacts increases as a result of a magnetic field being present, while the electrical potential at the other momentary sense contact decreases. However, the two sense contacts are at different common mode potentials. This means that (even) without a magnetic field being present, the electrical potentials at the momentary sense contacts 23 and 24 are generally not equal. The electrical potential at the first momentary sense contact 23 is closer to an electrical potential of a positive pole of the power supply (which is connected to the supply contact 21), whereas the electrical potential at the second momentary sense contact 24 is closer to the ground potential (which is connected to the supply contact 22).

The first and the second Hall effect regions 11, 12 may be symmetrical with respect to a symmetry axis or a symmetry plane. The two interconnection contacts 32, 33 may be symmetrical with respect to the symmetry axis or the symmetry plane, as well. In FIG. 3A for example, a first symmetry axis or a symmetry plane for the electronic device may be located between the first Hall effect region 11 and the second Hall effect region 12 in the y-z-plane, and a second symmetry axis or symmetry plane for only the first Hall effect region 11 may be located at the interconnection contact 32 in the y-z-plane. The electronic device 10 may further have a symmetry plane in the x-y-plane. With respect to the symmetry of the electronic device 10, it should be noted that it may typically not be necessary to distinguish between supply contacts and sense contacts, as these typically are only temporary functions of the corresponding spinning current contacts.

As can be seen in FIG. 3A and some of the subsequent figures, the first and second Hall effect regions 11, 12 may be disposed or arranged along a line. The line may extend along the longitudinal axis of the first and second Hall effect regions 11, 12 so that the longitudinal axes substantially coincide. The first and second semiconductor Hall effect devices are in this case longitudinally offset. Hence, the first end of the first Hall effect region 11 and the second end of the second Hall effect region 12 are exterior ends and the second end of the first Hall effect region 11 and the first end of the second Hall effect region 12 are interior ends with respect to the electronic device structure.

Some electronic devices, in particular Hall devices, that are not covered by the teachings disclosed herein use an arrangement with similar Hall devices, yet different connection and operation of the Hall devices. Such a device consists of a Hall effect region with four contacts. Two non-neighboring contacts are used as supply terminals and the other two are used as sense terminals in a first clock phase. In a second clock phase they are exchanged. Such a device not covered by the teachings disclosed herein typically lacks symmetry and therefore the voltage between both sense terminals has a huge value even at a vanishing magnetic field (i.e., huge offset error). Although in the second clock phase the offset has a different sign, it does not cancel in practice due to the non-linearity of the device.

According to the teachings disclosed herein, a twin-tub, three contact vertical Hall device is disclosed. More particularly, the vertical Hall device comprises three contacts per tub. Two tubs or Hall effect regions are connected by one wire or, more generally, by one electrically conductive connection. When considering the first clock phase of the spinning current scheme each tub has three contacts, namely one supply contact, one sense contact and one contact connected to the wire or the connection. The supply contact of the first tub is connected to the positive supply contact while the supply contact of the second tub is connected to the negative supply contact. Thus the electrical current enters the first tub 11 through the supply contact 21 of the first tub, then it flows through the first tub 11 into the (inter)connection contact 33, which establishes contact between the first tub 11 and the connecting wire 42. Then it flows through the wire 42 into the second tub 12, where it flows through the tub 12 into the negative supply contact 22 of the second tub. By flowing through the first and second tubs the current establishes a potential distribution in the tub(s) 11, 12. This potential distribution is mainly determined by the amount of electrical current that flows through the tub and by the conductivity of the tub. This conductivity may be a scalar, yet usually it is a second rank tensor that has different values of conductivity in different directions. In the presence of magnetic fields the conductivity tensor has some small magneto-conductive parts, which describe magneto-resistive effects and the Hall effect. The latter comprises the influence of the Lorentz force established by the magnetic field on the moving charges constituting the electrical current flow. Conversely, in the presence of mechanical stress, the conductivity tensor has some small piezo-resistive parts.

Another way to describe the electronic device 10 depicted in FIG. 3A is now presented. The electronic device 10 comprises a first Hall effect region 11 and a first group of three contacts 21, 32, 23 arranged in or on a surface of the first Hall effect region 11. The first group of three contacts 21, 32, 23 are arranged along a line so that the first group comprises two exterior contacts 21, 23 and one interior contact 32. The two exterior contacts 21, 23 are configured to function as a momentary supply contact and a momentary sense contact in an alternating manner. The electronic device 10 further comprises a second Hall effect region 12 and a second group of three contacts 24, 33, 22 arranged in or on a surface of the second Hall effect region 12. The second group of contacts 24, 33, 22 are arranged along a line so that the second group comprises two exterior contacts 24, 22 and one interior contact 33. The two exterior contacts 24, 22 are configured to function as a momentary supply contact and a momentary sense contact in an alternating manner. The interior contact 32 of the first group is connected to the interior contact 33 of the second group so that the first Hall effect region 11 and the second Hall effect region 12 are connected in series with respect to the first momentary supply contact 21 and the second momentary supply contact 22.

Figure 3B:
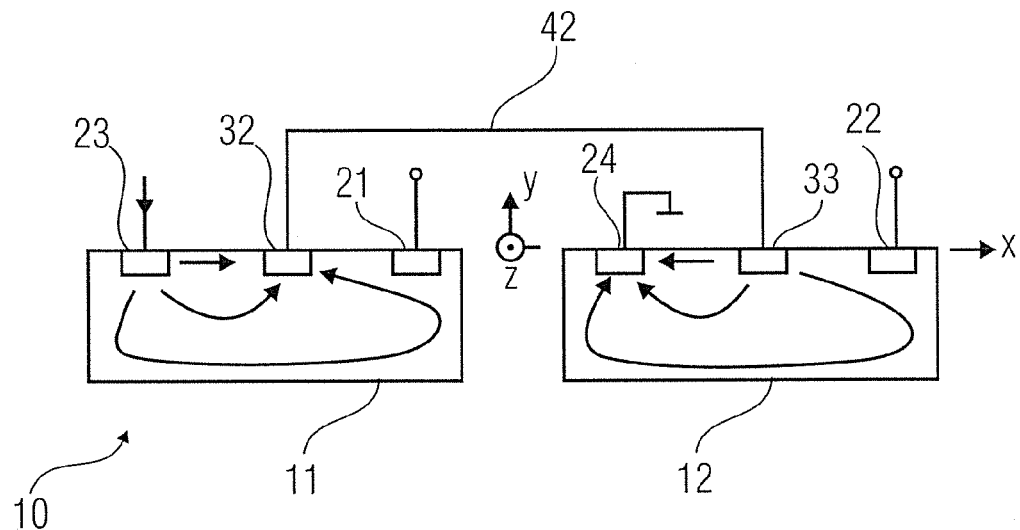
FIG. 3B shows a schematic cross section through the electronic device of FIG. 3A during a second phase of the measuring cycle.

FIG. 3B shows a schematic cross section of the electronic device 10 of FIG. 3A during a second clock phase of the measuring cycle, e.g., a spinning current cycle. The former supply contacts 21, 22 function as momentary sense contacts during the second clock phase. In turn, the former sense contacts 23, 24 function as momentary supply contacts during the second clock phase. The former supply contact 21 and the former sense contact 23 of the first Hall effect region 11 form a first pair of contacts that alternate with respect to their functions as supply contact and sense contact. Regarding the second Hall effect region 12, the former supply contact 22 and the former sense contact 24 form a second pair of contacts that alternate with respect to the function as momentary supply contact and momentary sense contact in the course of one measurement cycle. It can be seen in FIG. 3B that during the second clock phase the electrical current flows from the momentary supply contact 23 to the interconnection contact 32, wherein one portion flows relatively directly from left to right and another portion flows along a relatively large loop passing beneath (and possibly partly through) the momentary sense contact 21 in the first Hall effect region 11. In the second Hall effect region 12 the electrical current flows mostly from right to left between the interconnection contact 33 and the momentary supply contact 24. A portion of the electrical current flows along a loop which passes beneath (and possibly partly through) the momentary sense contact 22 to the momentary supply contact 24.

As can be seen in FIGS. 3A and 3B the teachings disclosed herein can be enhanced with the implementation of a spinning current technique. In a first operating phase the contacts are configured as shown in FIG. 3A. In a second operating phase the role of supply and sense terminals is exchanged or swapped. The sensed signals in both operating phases are added or subtracted (depending on if a measurement of magnetic fields via the Hall effect is to be implemented or a measurement of mechanical stress via the so-called Kanda effect). In accordance with the spinning current technique all supply contacts of the first operating phase are used as sense contacts in the second operating phase and vice versa. This typically guarantees good performance for spinning current techniques.

In the electronic device 10 shown in FIGS. 3A and 3B according to the teachings disclosed herein, two separate Hall effect regions (or Hall tubs) are connected with a wire (more generally, an electrically conducting connection) through which flows the complete supply current of the electronic device 10 (neglecting possibly leak currents). Each tub has one supply contact and one sense contact.

Figure 4A:
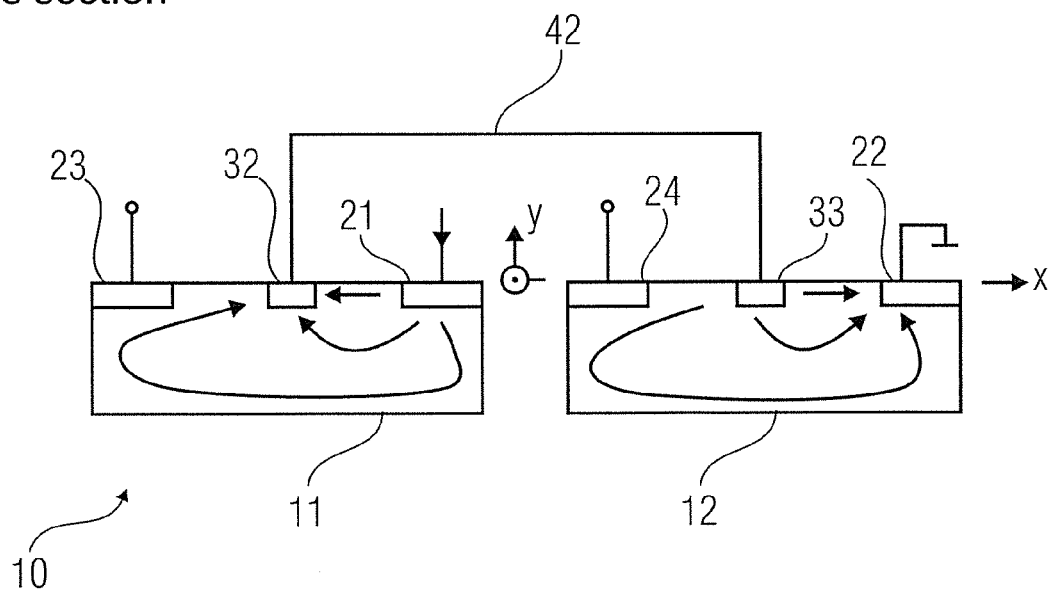
FIG. 4A shows a schematic cross section through an electronic device according to another embodiment of the teachings disclosed herein during a first phase of a measuring cycle.
Figure 4B:
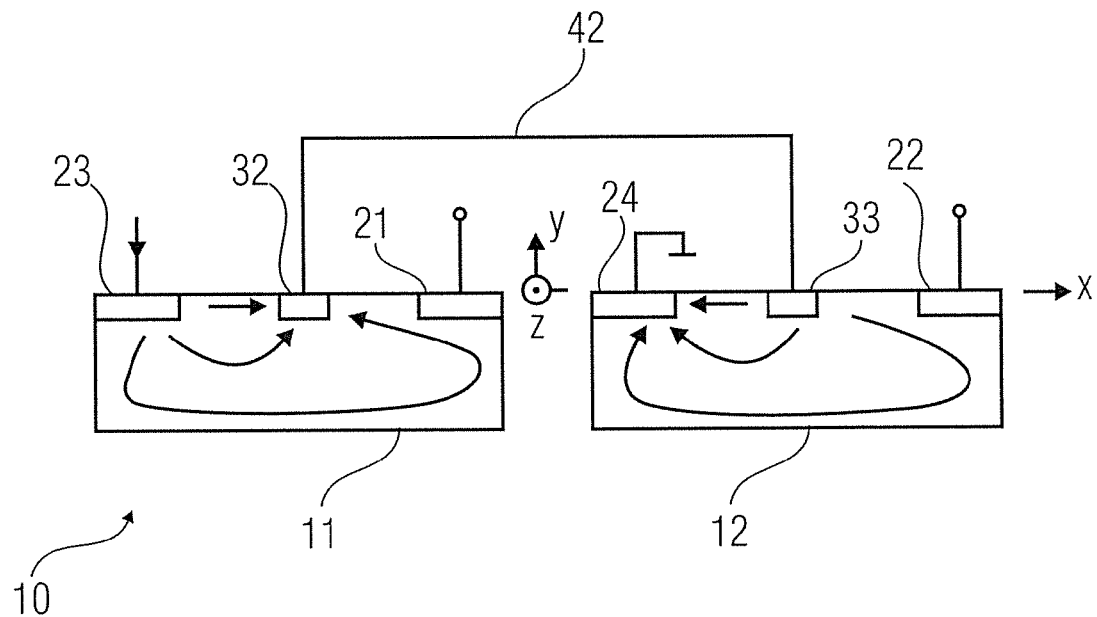
FIG. 4B shows a schematic cross section of the electronic device shown in FIG. 4A during a second phase of the measuring cycle.

FIGS. 4A and 4B show schematic cross sections of an electronic device 10 according to another embodiment of the teachings disclosed herein in its configuration during the first clock phase (FIG. 4A) and the second clock phase (FIG. 4B) of the measurement cycle. The electronic device 10 according to the embodiment shown in FIGS. 4A and 4B differs from the embodiment shown in FIGS. 3A and 3B in that the contacts 21, 23 of the first pair of contacts and the contacts 22, 24 of the second pair of contacts extend to the left or right ends of the first Hall effect region 11 or the second Hall effect region 12, respectively. In this manner, a contact resistance of the contacts 21 to 24 may be reduced.

Figure 5:
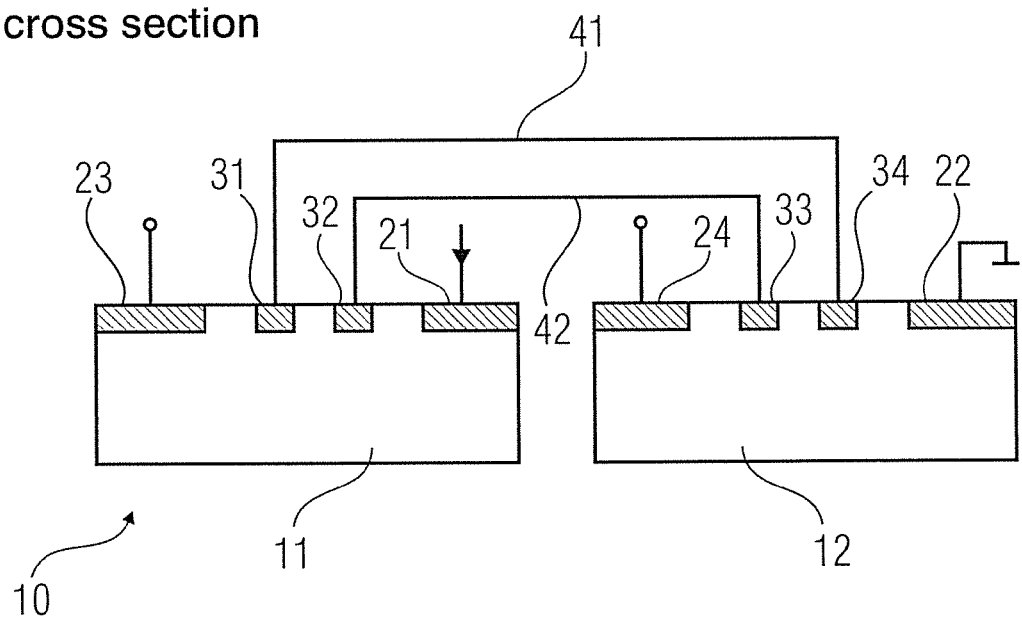
FIG. 5 shows a schematic cross section of an electronic device according to further a embodiment of the teachings disclosed herein.

FIG. 5 shows a schematic cross section of an electronic device 10 according to a further embodiment of the teachings disclosed herein. The embodiment shown in FIG. 5 is similar to the embodiment shown in FIGS. 4A and 4B. In addition to what is shown in FIG. 2A, the electronic device 10 according to the embodiment shown in FIG. 5 further comprises a second connection 41, which connects a further interconnection contact 31 arranged in or on the surface of the first Hall effect region 11 and a further interconnection contact 34 arranged in or on the surface of the second Hall effect region 12. The connection 42 and the further connection 41 are substantially parallel to each other in an electrical sense, with the exception that they are connected to different locations in or on the surface of first and second Hall effect regions 11, 12. The interconnection contact 32 and the further interconnection contact 31 are spatially arranged between the first pair of contacts 21, 23 at the surface of the first Hall effect region 11. The interconnection contact 33 and the further interconnection contact 34 are spatially arranged between the second pair of contacts 22, 24 at the surface of the second Hall effect region 12. Note that the two connections 41, 42 may still be regarded as a single connection between the first Hall effect region 11 and the second Hall effect region 12 because they both connect the same sub-portion of the first Hall effect region 11 with the same sub-portion of the second Hall effect region 12. Said sub-portion of the first Hall effect region 11 is located between the contacts 21, 23 of the first pair of contacts. The sub-portion of the second Hall effect region 12 is located between the contacts 22, 24 of the second pair of contacts. As a further option, the two connections 41, 42 may be electrically interconnected to each other so that the four sub-portions of the first and second Hall effect regions 11, 12 are connected.

Figure 6A:
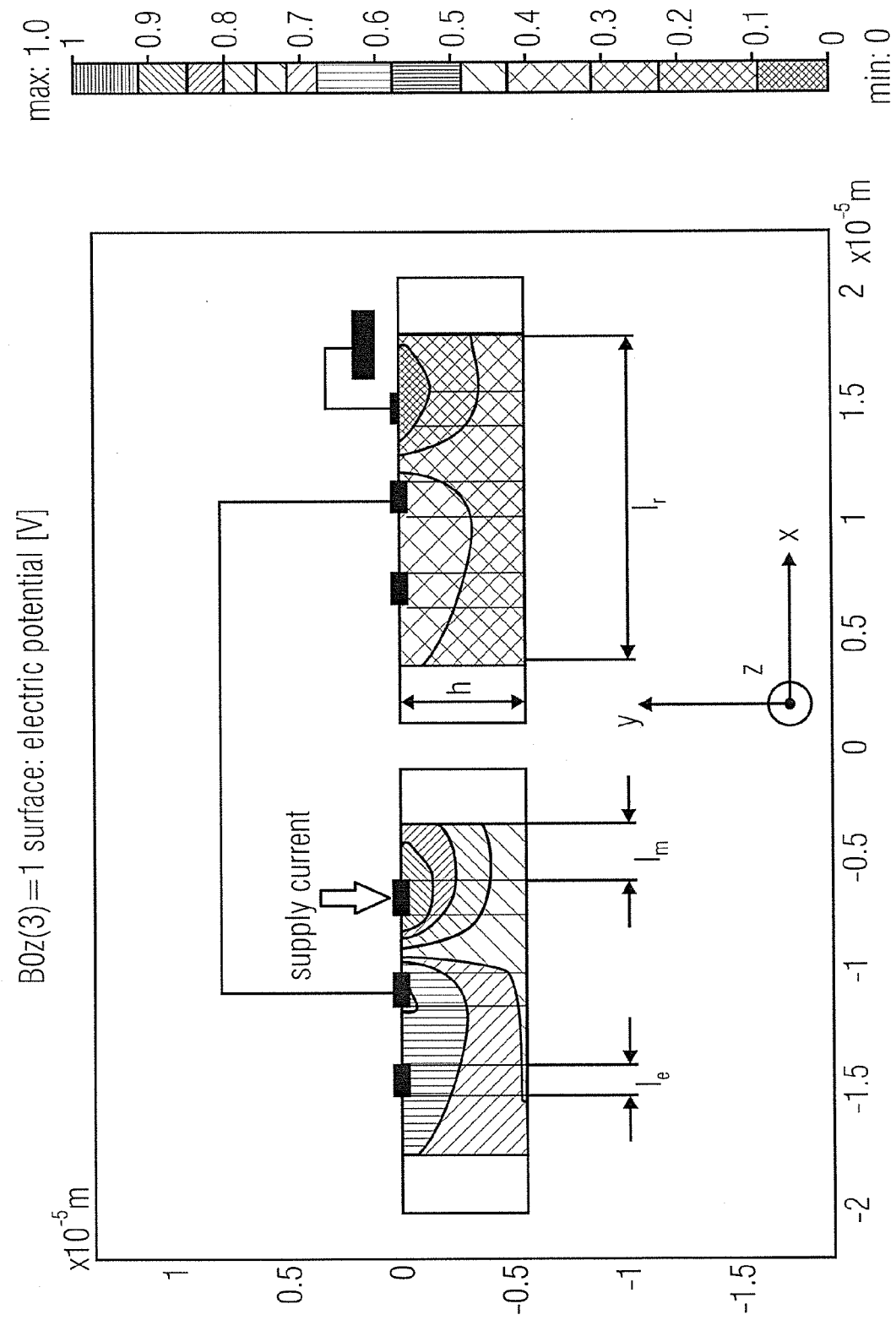
FIG. 6A shows a graph illustrating in a cross-sectional view a simulated electrical potential within the two Hall effect regions of the electronic device shown in FIG. 3A.
Figure 6B:
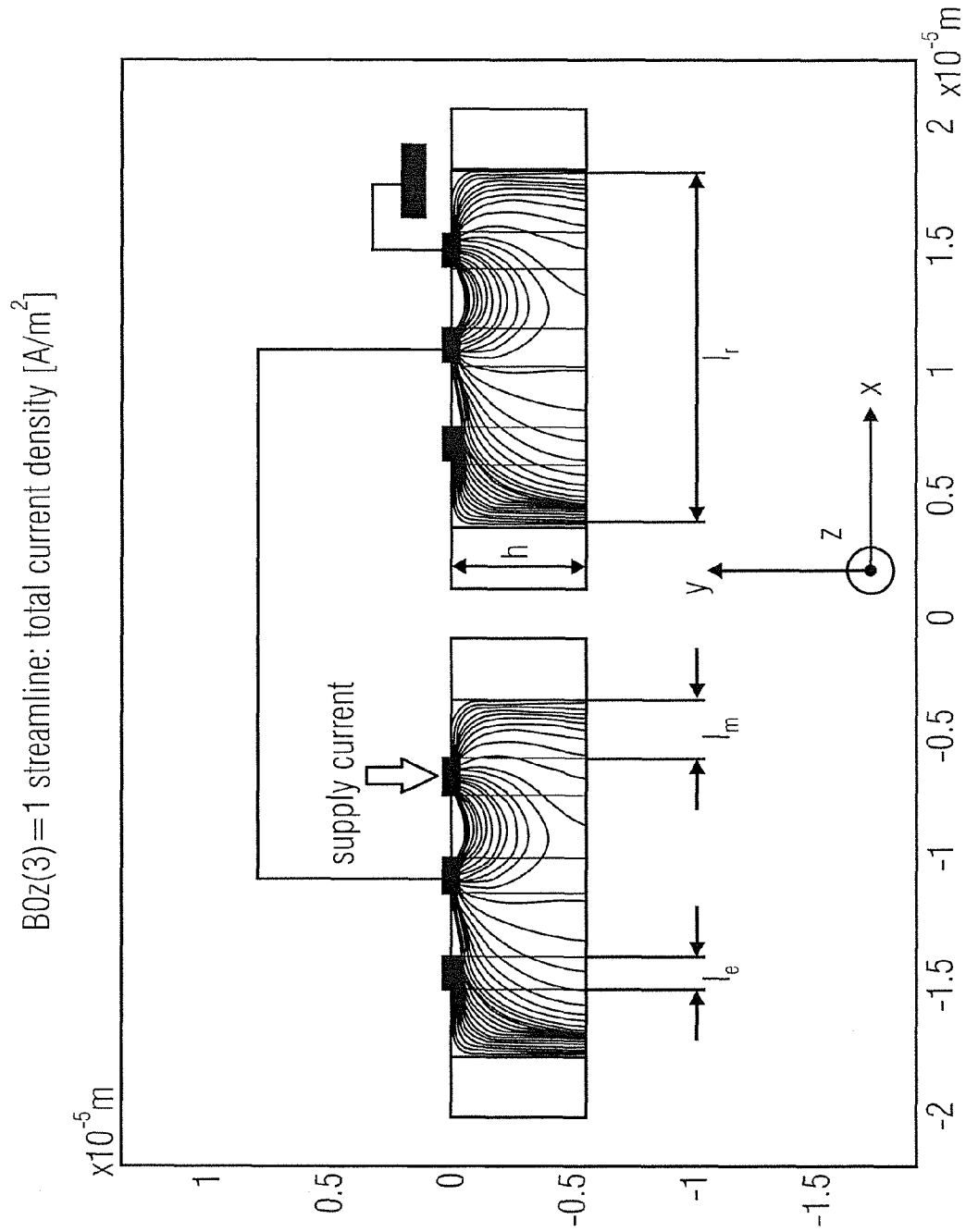
FIG. 6B shows a graph illustrating in a cross-sectional view simulated current stream lines within the two Hall effect regions of the electronic device shown in FIG. 3A.

FIGS. 6A and 6B illustrate some results of a numerical simulation of the electronic device according to the teachings disclosed herein. For the purpose of the simulation it has been assumed that an electrical voltage of 1V is applied between the first momentary supply contact 21 and the second momentary supply contact 22. Furthermore, a magnetic field strength of 1 Tesla in the z-direction has been assumed. An electrical potential within the first Hall effect region 11 and the second Hall effect region 12 is represented in FIG. 6A by areas of different hatchings (see legend at the right of FIG. 6A). The electrical potential is expressed in Volt (V). Another physical quantity that is illustrated in FIG. 6B is the total current density in A/m$^2$ in the form of streamlines. For the sake of the simulation it has been assumed that a highly conductive layer 71 is adjacent to the first Hall effect region 11 at a surface that is opposite to the surface at which the contacts 21, 23, and 32 are arranged. A second highly conductive layer 72 is arranged adjacent to the second Hall effect region 12 at a surface opposite to the surface where the contacts 22, 24, and 33 are arranged. However, the highly conductive layers 71, 72 are optional and embodiments of the teachings disclosed herein exist that have no highly conductive layer.

In particular, FIGS. 6A and 6B show the cross section of the two Hall effect regions or "tubs" 11, 12 which are connected by one wire 42 to form one device 10. The vertical axis with respect to the illustration of FIGS. 6A and 6B is the y-axis and its scale is given at the left hand side of the figure. The height y=0 marks the surface of the semiconductor die where the contacts 21, 23, 32, 22, 24, and 33 are located. The contacts are marked by thick black lines.

If a magnetic field parallel to the z-direction is present, it changes the electrical potential of the momentary sense contacts 23, 24 of both tubs 11, 12. The sense contacts 23, 24 are the ones that are illustrated as floating in FIG. 6A (i.e., they are not connected neither to positive or negative supply, respectively, nor to the connecting wire 42). FIG. 6B shows the current streamlines. In the plot illustrated in FIGS. 6A and 6B, a highly conductive bottom (i.e. the highly conductive layers 71, 72) of both tubs 11, 12 is assumed. This highly conductive bottom is typically an n-buried layer 71, 72. The tubs 11, 12 are usually lightly n-doped with $10^{15}$ to $10^{17}$ dopants per cm$^3$ (phosphorous or arsenic in silicon technology). Yet, the n-buried layer is not necessary for the invention. The n-buried layer may be present or not, depending on the technology that is used. A relatively high current density can be observed in the first Hall effect region 11 beneath the momentary sense contact 23. Furthermore, a relatively high current density in the vertical direction can also be observed at the left side and the right side of the Hall effect region 11. In a similar manner, a relatively high current density can be observed in the second Hall effect region 12 beneath the momentary sense contact 24 and also at the left end and the right end of the second Hall effect region 12. A magnetic field in the z-direction or mechanical stress within the first Hall effect region and/or the second Hall effect region 12 influences the electrical current distribution. A variation of the electrical current distribution causes a variation of the electrical potential at the momentary sense contacts 23, 24. Thus, the electrical potential at the momentary sense contacts 23, 24 is a function of the physical quantity (e.g., magnetic field strength or mechanical stress) to be measured. Note that FIGS. 6A, 6B show a configuration of the electronic device 10 that is designed to measure the magnetic field strength and to cancel out, as far as possible, any influence of the mechanical stress within the first Hall effect region 11 and the second Hall effect region 12.

For the simulation, the results of which are shown in FIGS. 6A, 6B, an electronic device 10 with the following dimensions has been used. A width of the electronic device 10 in the direction perpendicular to the drawing plane of FIGS. 6A, 6B is 3 μm. A height h is 5.5 μm and a length of the Hall effect region $l_r$ is 14.5 μm. Each of the electrodes 21 to 24, 32, and 33 has a length $l_e$ in the x-direction of 1.5 μm. A distance between the exterior electrodes 21 to 24 and a corresponding end of the Hall effect regions 11, 12 is designated as a margin length $l_m$ and is 2.5 μm. These dimensions may vary for example within a range of +/−50% or 25% of the corresponding above mentioned value. Notwithstanding the indicated values of the various dimensions of the Hall effect regions, the dimension may be subject to ample variations. For example, depending on the manufacturing technology Hall effect regions as thick as 100 μm may be possible. In this case also the other dimensions would vary significantly. Therefore, the mentioned dimensions shall be regarded as one possible example among a virtually infinite number of variants.

FIG. 7 illustrates the electrical potential along the surface (i.e. at y=0 and versus x=−2·10$^{-5}$ m . . . +2·10$^5$ m), where the full stroke line corresponds to a vanishing magnetic field, the dotted line corresponds to a magnetic field with Bz=+1 T, and the dashed line corresponds to a magnetic field with Bz=−1 T. It can be seen that the positive supply contact is at +1V, that the negative supply contact is at 0V, and that the interconnection contacts 32, 33 are at approximately 0.5V. The sense contact 23 of the left tub or the first Hall effect region 11 is near x=−10$^{-5}$ m and at a potential of about 0.68V at 0 field (full stroke line). The sense contact 24 of the right tub or the second Hall effect region 12 is near x=10$^{-5}$ m and at an electrical potential of about 0.32V at 0 magnetic field. Hence, the electrical potential at both sense contacts 23, 24 are not equal at 0 magnetic field and accordingly they are said to have different common modes.

At a positive Bz-field the potential at the left sense contact 23 is raised while the potential at the right sense contact 24 is lowered. By exchanging the sense contact 24 and the supply contact 22 of the second Hall effect region 12, the electrical potential at the (new) sense contact 22 in the second Hall effect region 12 would also rise at a positive magnetic field.

Since the electrical supply current flows through both Hall effect regions 11, 12, it is used twice, which makes the electronic device 10 economical. It uses only a little electrical current to generate two sense signals. The voltage between the sense contacts 23 and 24 varies from approximately 0.32V for a magnetic field of −1 T to approximately 0.4V for a magnetic field of +1 T. The voltage corresponding to a zero magnetic field is approximately 0.36V.

In practice it may be difficult to evaluate the sensed signals, since they are on top of large common voltages. A second electronic device of similar construction may be used which also has a left and a right tub (referred to as third Hall effect region 13 and fourth Hall effect region 14) with a sense contact in the left tub 13 and a sense contact in the right tub 14.

Figure 8:
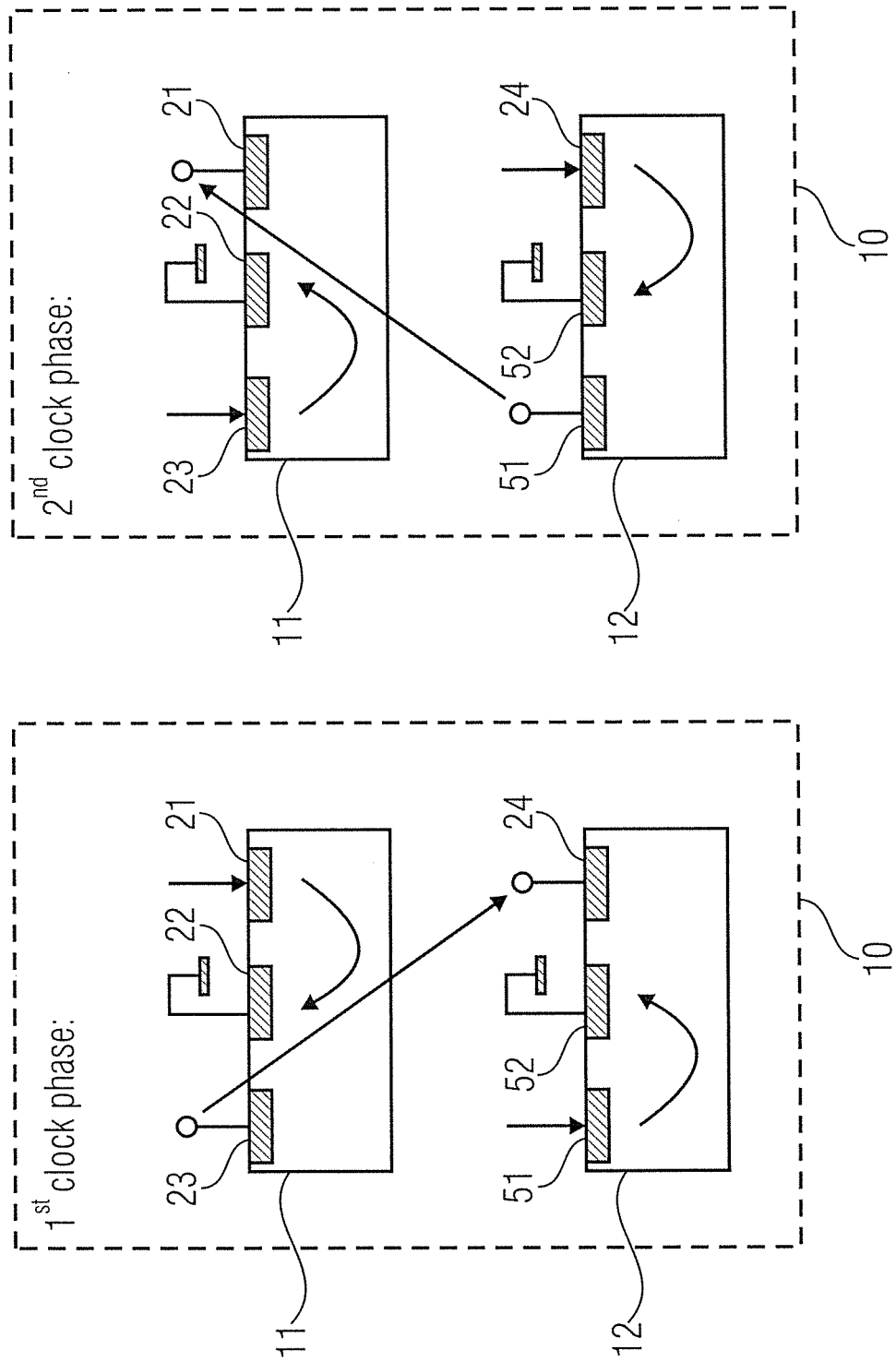
FIG. 8 shows a schematic view of an electronic device according to an embodiment where the ground potential serves as an interconnection between two Hall effect regions.

FIG. 8 shows schematically an electronic device 10 according to a further embodiment of the teachings disclosed herein. The electronic device 10 is shown in a configuration of a first clock phase (left) of a spinning current cycle and in a configuration of a second clock phase (right) of the spinning current cycle. The electronic device 10 comprises a first Hall effect region 11 and a second Hall effect region 12. The first Hall effect region 11 has three contacts 21, 22, 23. The middle contact 22 and the right contact 21 are configured to function as supply contacts during the first clock phase. The left contact 23 is configured to function as a momentary sense contact during the first clock phase. The second Hall effect region 12 also has three contacts 51, 52, and 24. The left contact 51 and the middle contact 52 are configured to function as supply contacts during the first clock phase. The right contact 24 is configured to function as a sense contact during the first clock phase. A differential sense signal may be measured between the momentary sense contacts 23 and 24.

During the second clock phase the electrical current is supplied to the first Hall effect region 11 via the third contact 23 and leaves the first Hall effect region 11 via the second contact 22. The electrical current supplied to the second Hall effect region 12 enters the same via the third contact 24 and leaves the second Hall effect region 12 via the second contact 52.

According to the embodiment shown in FIG. 8, the two Hall effect regions 11 and 12 are connected to each other via the ground potential. This means that the node, to which the interconnection contacts 22 and 52 are connected, typically is not electrically isolated against other circuit parts, but is contacted by a large number of other circuit components, as it is the reference potential.

Figure 9A:
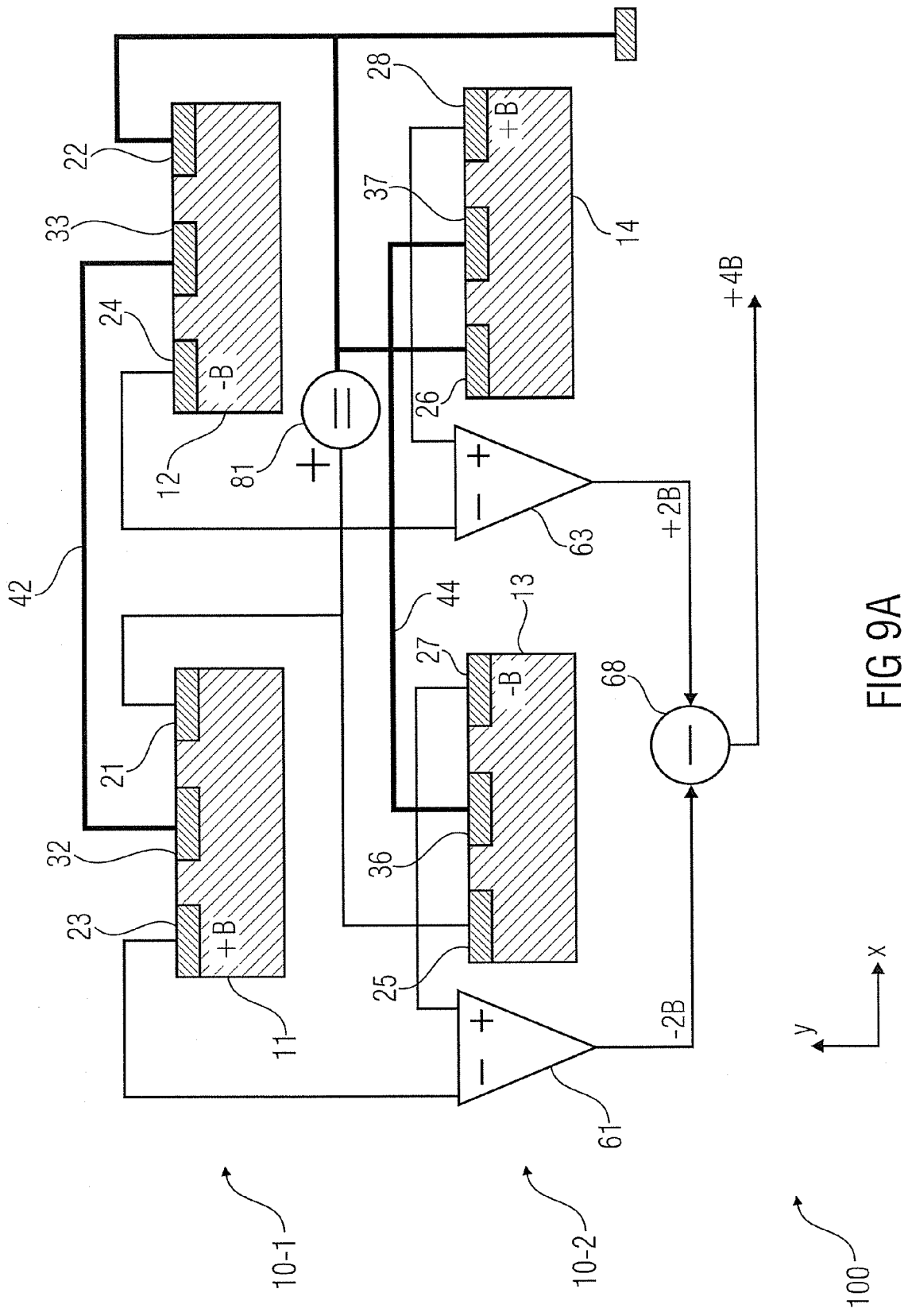
FIG. 9A shows a schematic view of an electronic device according to an embodiment with four Hall effect regions, two of which are connected in a first series connection and the other two Hall effect regions being connected in a second series connection.

FIG. 9A shows a schematic circuit diagram of an electronic device 100 according to a further embodiment of the teachings disclosed herein that comprises two substantially similar electronic devices 10-1, 10-2 as shown in FIGS. 3A and 3B. Accordingly, the electronic device shown in FIG. 9A comprises a third Hall effect region 13 and a fourth Hall effect region 14. A third pair of contacts 25, 27 in or on the surface of the third Hall effect region 13 comprises the momentary supply contact 25 and the momentary sense contact 27 for the first operation phase of a measurement cycle (the electronic device 100 is depicted in the configuration of the first operation phase in FIG. 9A). A first interconnection contact 36 is also arranged in or on the surface of the third Hall effect region 13. A fourth pair of contacts 26, 28 comprising a momentary supply contact 26 and a momentary sense contact 28 is arranged in or on the surface of the fourth Hall effect region 14. A fourth interconnection contact 37 is also arranged in or on the surface of the fourth Hall effect region 14. The third interconnection contact 36 and the fourth interconnection contact 37 are connected to each other by means of a connection 44.

In the embodiment shown in FIG. 9A, the four Hall effect regions 11, 12, 13, and 14 are substantially identical. However, in alternative embodiments, the first Hall effect region 11 and the third Hall effect region 13 may be substantially identical to each other, while the second Hall effect region 12 and the fourth Hall effect region 14 may be substantially identical to each other, but not to the first and third Hall effect regions 11, 13.

A positive terminal of a voltage supply 81 is connected to the first momentary supply contact 21 and the third momentary supply contact 25. A negative terminal of the voltage supply 81 is connected to the second supply contact 22 and the fourth supply contact 26. The first momentary supply contact 21 is located at a right end of the first Hall effect region 11, whereas the third momentary supply contact 25 of the third Hall effect region 13 is located at a left end of the third Hall effect region 13, i.e., at a corresponding opposite end of the third Hall effect region 13. The second momentary supply contact 22 and the fourth momentary supply contact 26 are also located at corresponding opposite ends of the second Hall effect region 12 and the fourth Hall effect region 14.

The first momentary sense contact 23 is connected to a negative input terminal of an amplifier 61, such as an instrumentation amplifier. The third momentary sense contact 27 located in or at the surface of the third Hall effect region 13 is connected to a positive input terminal of the first amplifier 61. The second momentary sense contact 24 of the second Hall effect region 12 is connected to a negative input terminal of a second amplifier 63, and the fourth momentary sense contact 28 of the fourth Hall effect region 14 is connected to a positive input terminal of the second amplifier 63. The second amplifier 63 may also be an instrumentation amplifier. An output of the first amplifier 61 and an output of the second amplifier 63 are connected to a subtraction circuit 68 that provides an output signal of the electronic device 100, the output signal being indicative of the magnetic field strength.

The first amplifier 61 functions as a first differential signal amplifier configured to provide a first differential signal on the basis of a first sense signal (i.e., the sense signal tapped at the momentary first sense contact 23) and a third sense signal (i.e. the sense signal tapped at the momentary third sense contact 27). The first differential signal is proportional to −2B, where B is the magnetic field strength in the z-direction. The second amplifier 63 functions as a second differential signal amplifier configured to provide a second differential signal on the basis of a second sense signal and a fourth sense signal, the second differential signal being proportional to +2B. The second sense signal is tapped at the second momentary sense contact 24 and the fourth sense signal is tapped at the fourth momentary sense contact 28. Hence, the output signal provided by the subtraction circuit 68 is proportional to +4B.

When comparing the first Hall effect region 11 and the third Hall effect region 13 it can be seen that the momentary sense contacts 23, 27 and the momentary supply contacts 21, 25 are substantially "mirrored". Furthermore, the two momentary supply contacts 21, 25 are both connected to the positive terminal of the voltage supply 81 so that, due to the substantially symmetric structure of the first and third Hall effect regions 11, 13, the two momentary sense contacts 23, 27 are approximately at the same common mode potential. This means that an electrical potential difference between the negative input terminal and the positive input terminal of the amplifier 61 is primarily influenced by the physical quantity to be measured, e.g. the magnetic field in the z-direction. The magnetic field in the z-direction causes the electrical potential difference between the first momentary sense contact 23 and the second momentary sense contact 27 because in the first Hall effect region 11 the electrical current flows from the rightmost contact 21 to the center contact 32, whereas in the third Hall effect region 13 the electrical current flows from the leftmost contact 25 to the center contact 36. In other words, the electrical currents in the first and third Hall effect regions 11, 13 flow in opposite directions, at least in the x-direction.

The second momentary sense contact 24 and the fourth momentary sense contact 28 are also substantially at the same common mode potential and the electrical currents in the second Hall effect region 12 and the fourth Hall effect region 14 flow substantially in opposite directions, at least in the x-direction.

In other words, the schematic circuit diagram shown in FIG. 9A may be summarized as follows. If the supply contact of the third Hall effect region 13 (i.e., the left tub of the second device) is connected to the positive supply potential of the voltage source 81, the common mode potentials of the sense contacts 23, 27 of the left tubs 11, 13 of both devices 10-1, 10-2 are equal (or at least very similar in view of small unavoidable mismatches). The differential output signal may therefore be processed, which is the difference of the signals tapped at these two contacts 23, 27. Analogously, the difference of the output signals tapped at the sense contacts 24, 28 of the right tubs 12, 14 of both devices may be processed. Thus, the circuit schematically illustrated in FIG. 9A is configured to detect a Bz-field (=magnetic field perpendicular to the drawing plane).

Figure 9B:
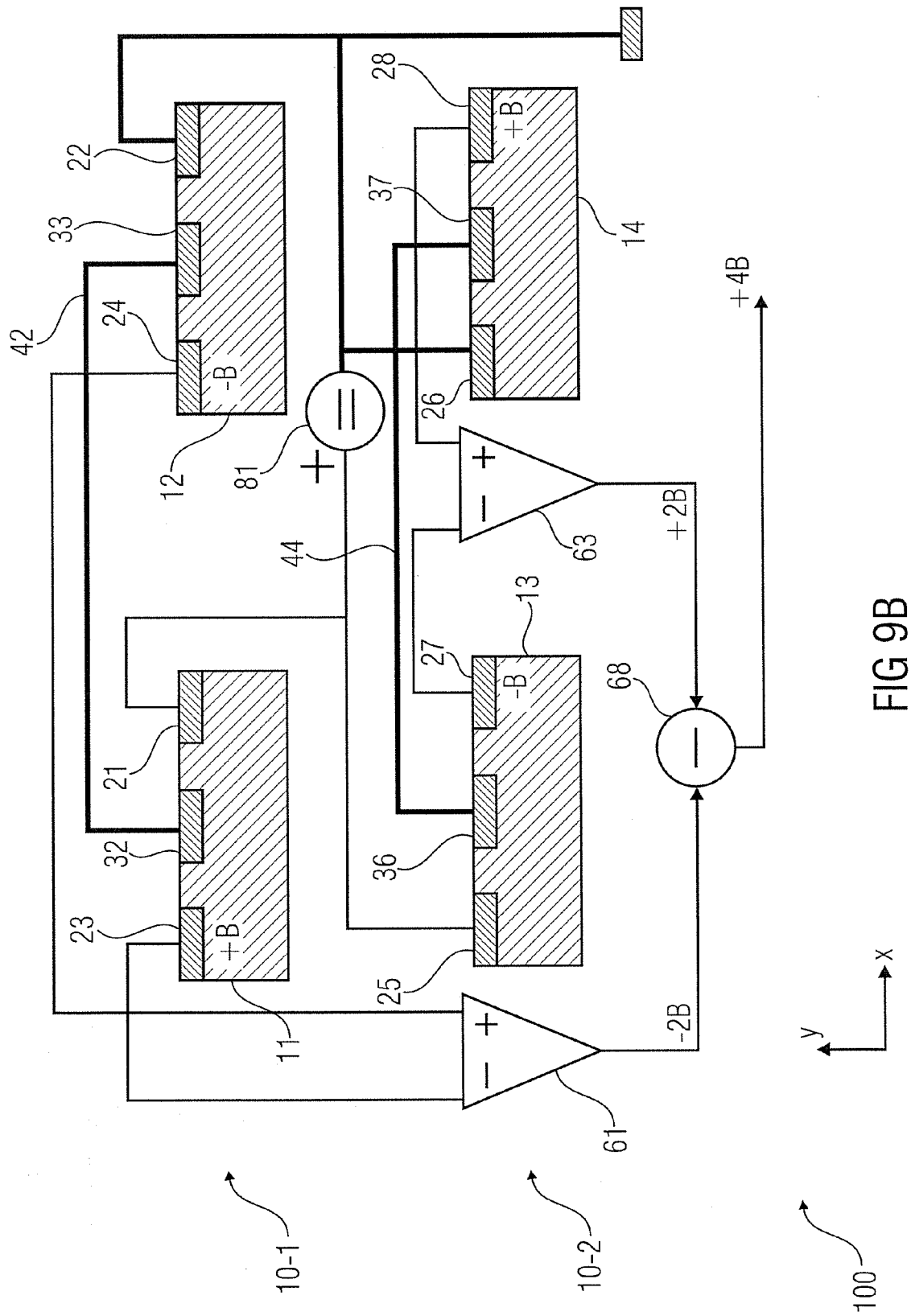
FIG. 9B shows a schematic view of an electronic device similar to the embodiment shown in FIG. 9A.

FIG. 9B shows another embodiment of an electronic device 100 according to the teachings disclosed herein which is similar to the embodiment shown in FIG. 9A. The first amplifier 61 is connected to the first and second momentary sense contacts 23, 24. The second amplifier 63 is connected to the third and fourth momentary sense contacts 27, 28.

The electrical potentials at the first momentary sense contact 23 and the fourth momentary sense contact 28 are proportional to +B. The electrical potentials at the second momentary sense contact 24 and the third momentary sense contact 27 are proportional to −B. The negative input terminal of the first amplifier 61 is connected to the first momentary sense contact 23 and the positive input terminal of the amplifier 61 is connected to the third momentary sense contact 27. Therefore, an output of the amplifier 61 is proportional to −2B. With respect to the second amplifier 63, a negative input terminal is connected to the second momentary sense contact 24 and a positive input terminal is connected to the fourth momentary sense contact 28. Accordingly, the output of the amplifier 63 is proportional to +2B. After subtracting the output of the first amplifier 61 from the output of the second amplifier 63, an output signal proportional to +4B is obtained at the output of the subtraction circuit 68.

In the configuration shown in FIG. 9B, the amplifiers 61, 63 are typically amplifiers that are capable of amplifying relatively large differential voltages at the amplifier input(s). For example, the amplifiers 61, 63 should typically be capable of amplifying a differential voltage of approximately 100 mV in a substantially perfect linear manner.

When comparing the embodiments shown in FIGS. 9A and 9B, it can be observed that in FIG. 9A the order of the subtractions that are performed is $(P_{27}-P_{23})-(P_{28}-P24)$, where $P_x$ stands for the electrical potential at the contact with reference numeral x. In contrast, the order of the subtractions performed in the embodiment of FIG. 9B is $(P_{24}-P_{23})-(P_{28}-P_{27})$. Resolving the brackets reveals that both expressions are identical and yield $P_{27}-P_{23}-P_{28}+P_{24}$. The difference is that with the embodiment according to FIG. 9A the terms within the brackets are identical or close to zero for a zero magnetic field, whereas for the FIG. 9B embodiment both bracket terms have a relatively large non-zero value at zero magnetic field, e.g. 0.3V and cancel out only when subtracting the second bracket $(P_{28}-F_{27})$ term from the first bracket term $(P_{24}-P_{23})$.

Figure 10:
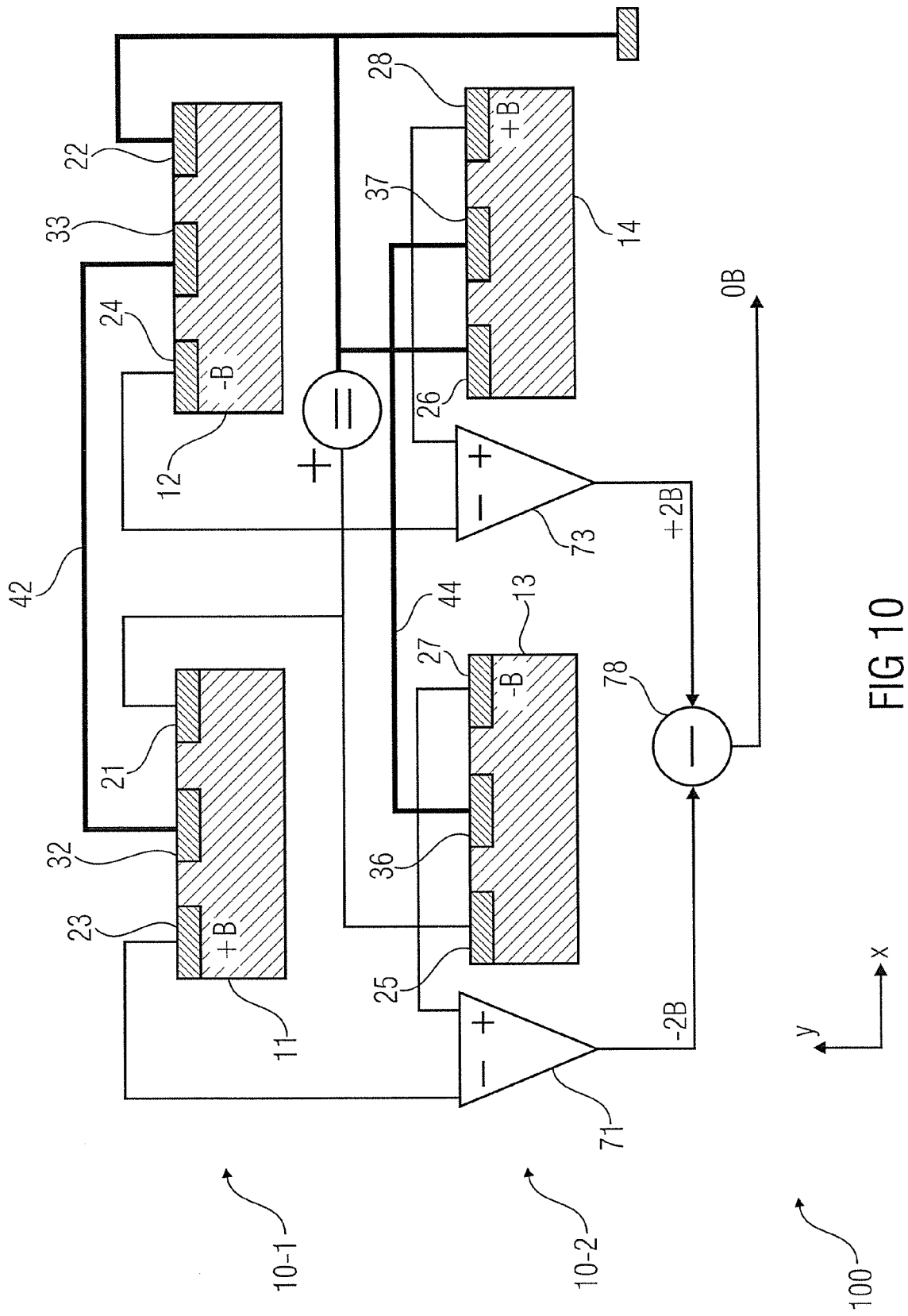
FIG. 10 shows a schematic view of an electronic device according to another embodiment with four Hall effect regions.

FIG. 10 shows a schematic circuit diagram of an electronic device 100 configured to measure mechanical stress within the electronic device, in particular in the four Hall effect regions 11 to 14. Note that in the first Hall effect region 11 and the second Hall effect region 12 the momentary sense contacts 23, 24 are both located at the left end of the corresponding Hall effect region, 11, 12, respectively. Furthermore, the momentary supply contacts 21, 22 are both located at the corresponding right end of the Hall effect regions 11, 12. Regarding the third Hall effect region 13 and the fourth Hall effect region 14, the momentary supply contacts 25, 26 are located at the corresponding left end of the third Hall effect region 12 and the fourth Hall effect region 14, respectively. The momentary sense contacts 27, 28 are both located at the corresponding right ends of the Hall effect regions 13, 14, respectively. The negative input terminal and the positive input terminal of an amplifier 71 are connected to the momentary sense contacts 23, 27. The momentary sense contacts 24, 28 of the second Hall effect region 12 and the fourth Hall effect region 14 are connected to a second amplifier 73. The outputs of the first amplifier 71 and the second amplifier 73 are provided to an addition circuit 78. An output of the addition circuit 78 indicates a mechanical stress within the electronic device 100. The influence of the magnetic field on the output of the addition circuit 78 is substantially canceled out because the output of the first amplifier 61 is proportional to −2B and the output of the second amplifier 63 is proportional to +2B.

In FIGS. 9A, 9B, and 10, a voltage source 81 is shown that is connected to the momentary supply contacts of the devices. If current sources are used instead, there are two possibilities. A single current source can be connected with its positive supply terminal to both positive supply contacts similar to the case of the voltage source. However, the current supply may also be split up in two parts, where a first part supplies only the first device (i.e. first Hall effect region 11 and second Hall effect region 12), and a second part supplies only the second device (i.e., third Hall effect region 13 and fourth Hall effect region 14).

The output signals may be voltages, which are tapped at the momentary sense contacts 23, 24, 27, 28 in the case of the first operating phase. However, electrical currents which are tapped between two contacts by shorting them via an amperemeter (or an electronic circuit which represents an amperemeter having negligible input resistance and measuring the current flow through its input terminals) are also possible. Alternatively, a feedback circuit may be implemented that adds current at one of its input terminals of just the right amount to make the potentials at both input terminals identical.

Accordingly, the electronic device may comprise a current source that is connectable to the first momentary supply contact and the second momentary supply contact. An electronic device comprising four Hall effect regions 11 to 14 may comprise a current source having a positive terminal and a negative terminal. The positive terminal of the current source may be connectable to the first momentary supply contact and the third momentary supply contact. The negative terminal of the current source may be connectable to the second momentary supply contact and the fourth momentary supply contact. In an alternative embodiment, the electronic device may comprise two current sources. A first current source may be connectable to the first momentary supply contact and the second momentary supply contact. A second current source may be connectable to the third momentary supply contact and the fourth momentary supply contact.

The amperemeter may be regarded as a current sensing device that is connectable between the first momentary sense contact 23 and the third momentary sense contact 27. The electrical current sensed by the current sense device may then represent the signal between the first momentary sense contact 23 and the third momentary sense contact 27. The value of the electrical current or its variation may be indicative of the magnitude of the physical quantity or of its variation. The current sensing device could also be connected in a similar manner as the amplifiers 61, 63, 71, and 73 in FIGS. 9A, 9B, and 10. For example, a first current sensing device may connectable between the first momentary sense contact 23 and the third momentary sense contact 27 during the first operating phase. A second current sensing device may be connectable between the second momentary sense contact 24 and the fourth momentary sense contact 28 during the first operating phase. During the second operating phase, the first and second current sensing devices may be connectable to the former supply contacts 21, and 25, and/or 22 and 26.

The feedback circuit mentioned above may be connectable to the first momentary sense contact 23 and the second momentary sense contact 24. The feedback circuit may be configured to add an electrical current at one of its input terminals to make the electrical potentials at both input terminals identical (by using an operational amplifier, for example). In an alternative embodiment, the feedback circuit may be connectable to the first momentary sense contact 23 and the third momentary sense contact 27. A further feedback circuit may be connectable to the second momentary sense contact 24 and the fourth momentary sense contact 28.

Figure 11:
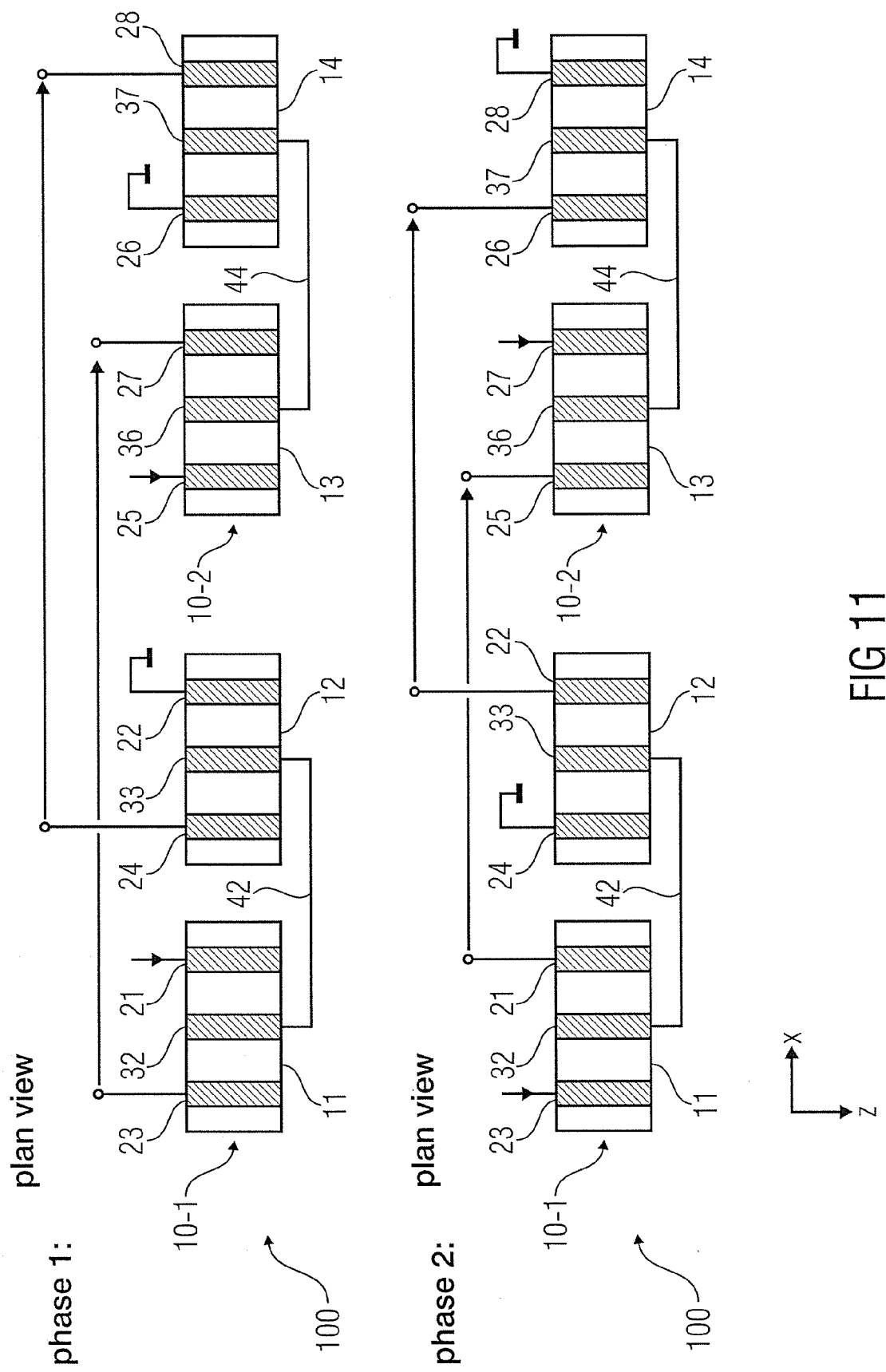
FIG. 11 shows two schematic plan views of an electronic device according to a further embodiment of the teachings disclosed herein during a first phase and a second phase of a measuring cycle, the electronic device comprising four Hall effect regions.

FIG. 11 shows two schematic top views of an electronic device according to a further embodiment of the teachings disclosed herein during a first phase (top) and a second phase (bottom) of a measuring cycle. The electronic device 100 comprises four Hall effect regions 11, 12, 13, 14. The first and second Hall effect regions 11, 12 belong to a first basic electronic device 10-1. The third and fourth Hall effect regions 13, 14 belong to a second basic electronic device 10-2. Corresponding cross-sectional views can be readily derived from the schematic plan views in FIG. 11 in an analogous manner as in FIG. 3A. The configuration shown in FIG. 11 is substantially similar to the configuration shown in FIG. 9A. As a difference, the four Hall effect regions 11 to 14 are arranged along a line in the configuration of FIG. 11, whereas in FIG. 9A the four Hall effect regions 11 to 14 are arranged in 2×2 array. Not shown in FIG. 11 is the voltage supply 81, the first amplifier 61, and the second amplifier 63.

An output signal of the electronic device shown in FIG. 11 is determined on the basis of a first electrical potential within the first basic electronic device 10-1 (for example, at the momentary sense contact 23 during the first operating phase), and a second electrical potential within the second basic electronic device 10-2 (for example at the momentary sense contact 27) during the first operating phase. Furthermore, an electrical potential at the momentary sense contact 24 of the second Hall effect region 12 and an electrical potential at the momentary sense contact 28 at the fourth Hall effect region 14 may also contribute to the output signal of the electronic device shown in FIG. 11 during the first operating phase.

During the second operating phase illustrated in the lower part of FIG. 11, the output signal of the electronic device 100 is based on the electrical potentials at the momentary sense contacts 21, 22, 25, and 26 (which have been momentary supply contacts during the first operating phase). A first differential signal is determined between the momentary sense contacts 21 and 25. A second differential signal is determined between the momentary sense contacts 22 and 26. The configuration shown in FIG. 11 may be regarded as a longitudinal configuration. Alternatively, it is also possible to connect the connection 42 to the connection 44.

Figure 12:
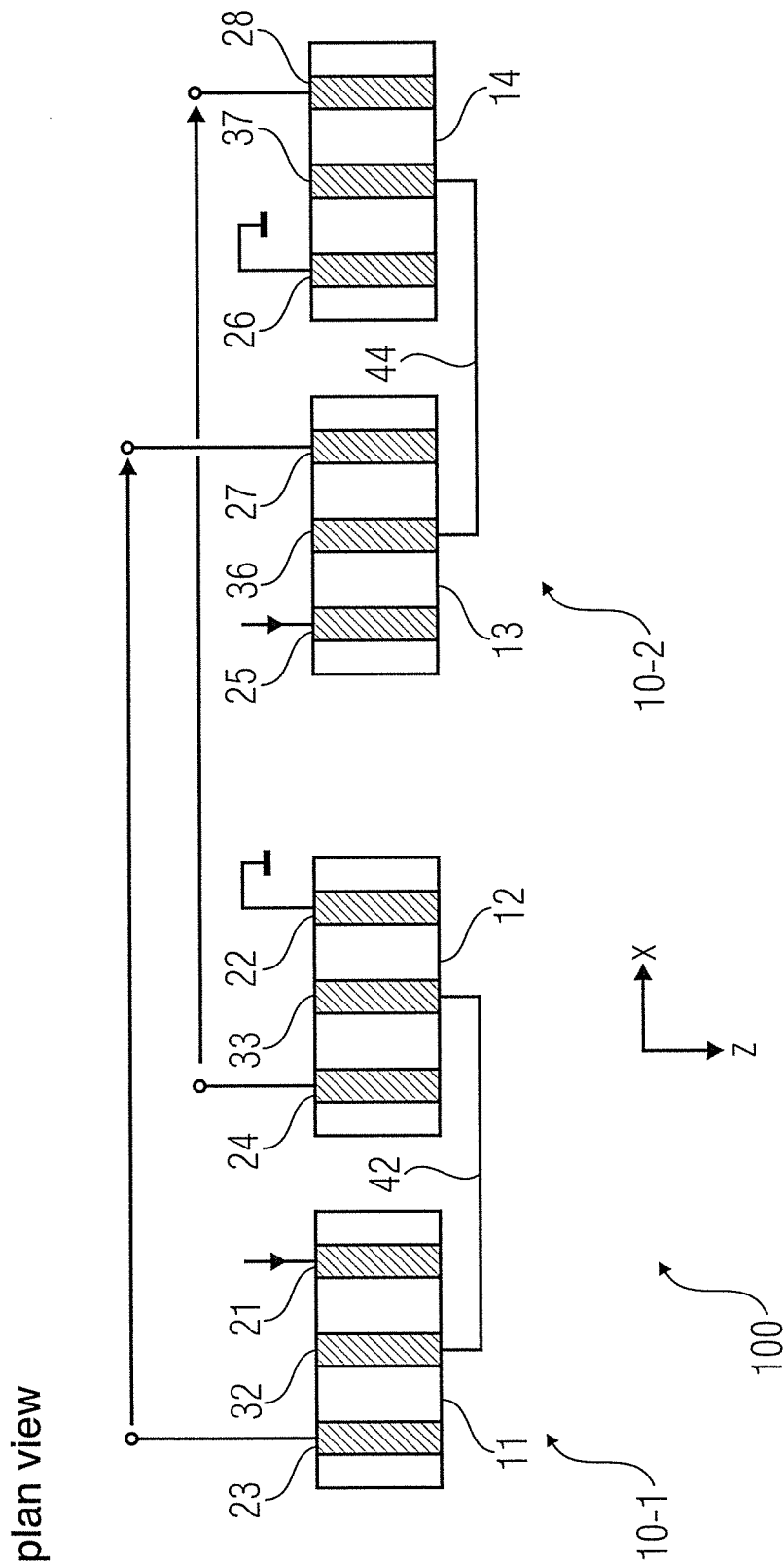
FIG. 12 shows a schematic plan view of an electronic device according to an embodiment with four Hall effect regions arranged along a line.

FIG. 12 shows a schematic plan view of an electronic device 100 according to an embodiment of the teachings disclosed herein with four Hall effect regions 11 to 14 arranged in a line, i.e. a longitudinal configuration. The corresponding cross section can be readily derived from the schematic plan view of FIG. 12 in an analogous manner as in FIG. 3A. FIG. 12 shows the configuration during the first clock phase of the spinning current cycle or measuring cycle. The configuration may be described as follows in condensed form. Both Hall effect regions that are interconnected to each other either by means of the connection 42 or the connection 44 are lined up on a single axis. Furthermore, both pairs of Hall effect regions (i.e., both basic electronic devices 10-1, 10-2) are also lined up on the same axis. The first basic electronic device 10-1 comprising the Hall effect regions 11 and 12 is substantially identical to the pair of Hall effect regions 11, 12 shown in FIG. 9A. Two differential sense signals, in particular two differential voltages may be measured. A first differential voltage is between i) the momentary sense contact 23 formed at the surface of the first Hall effect region 11 of the first basic electronic device 10-1 and ii) the momentary sense contact 27 formed at the surface of the third Hall effect region 13 of the second basic electronic device 10-2. Hence, the differential voltage is measured in a basic electronic device-spanning manner (which is also true for the configuration shown in FIG. 9A). A second differential voltage is measured between iii) the momentary sense contact 24 formed at the surface of the second Hall effect region 12 of the first basic electronic device 10-1 and iv) the momentary sense contact 28 formed at the surface of the fourth Hall effect region 14 of the second basic electronic device 10-2.

Depending on whether the two differential voltages $P_{23}-P_{27}$ and $P_{24}-P_{28}$ are subtracted or added, the configuration shown in FIG. 12 does or does not markedly respond to a magnetic field in the z-direction, i.e., the direction in the drawing plane that is perpendicular to the longitudinal axis of the electronic device 100. At the sense contact 23 the potential decreases with increasing magnetic field in the z-direction, whereas the potential at the sense contact 27 increases. At the sense contact 24 the potential increases with increasing magnetic field and at the sense contact 28 the potential decreases. When the two differential voltages $P_{23}-P_{27}$ and $P_{24}-P_{28}$ are subtracted, the structure shown in FIG. 12 is capable of sensing mechanical stress within the semiconductor crystal in which the structure is formed. Furthermore, by reversing the polarity of the power supply at one of the pairs of Hall effect regions only, the electronic device may be configured to measure either the magnetic field or the mechanical stress. An electronic device as disclosed herein thus also encompasses a mechanical stress sensor. Features that are claimed and/or described in connection with the electronic device for sensing a magnetic field are typically also applicable to the mechanical stress sensor, provided that the above mentioned condition regarding the polarity of the power supply is fulfilled.

Figure 13:
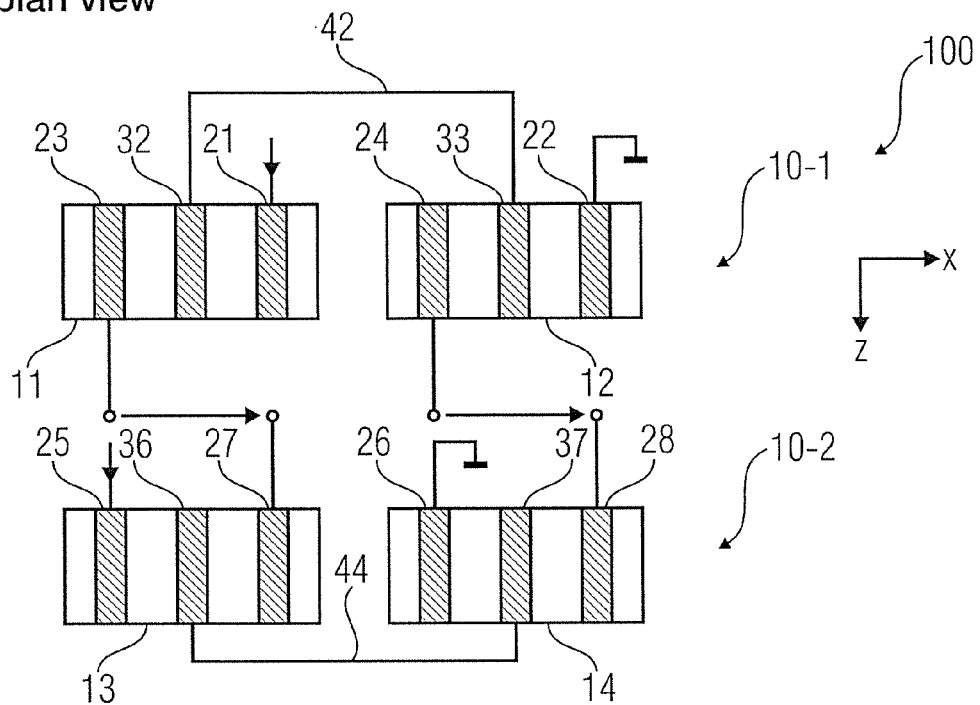
FIG. 13 shows a schematic plan view of an electronic device according to an embodiment with four Hall effect regions arranged in a quadrangle.
Figure 14:
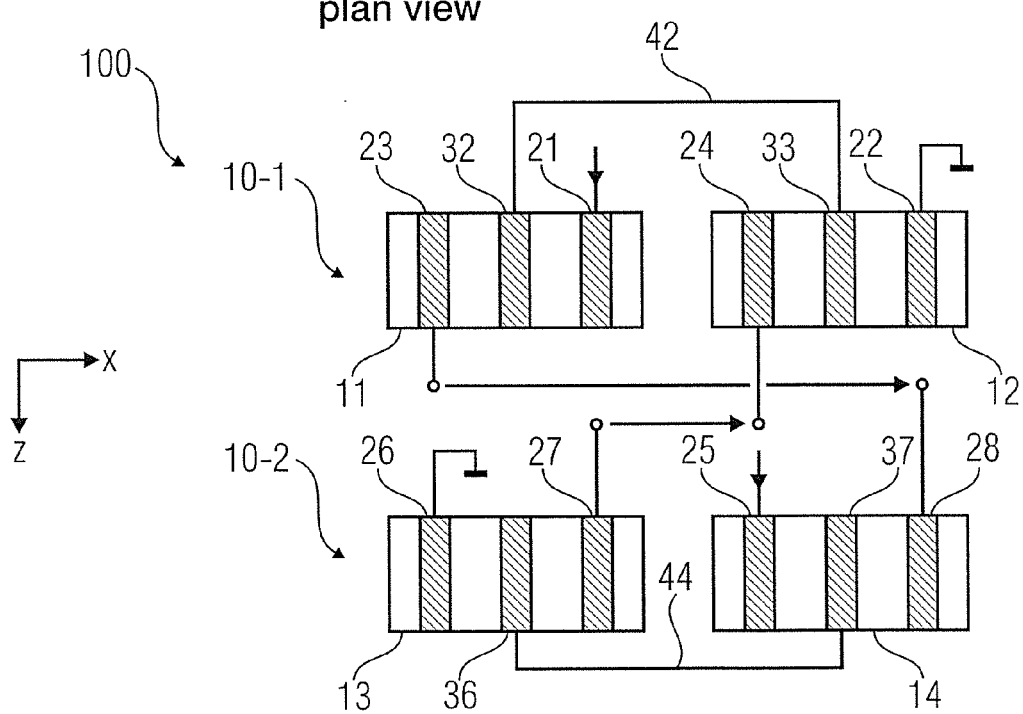
FIG. 14 shows a schematic plan view of an electronic device according to another embodiment with four Hall effect regions arranged in a quadrangle.
Figure 15:
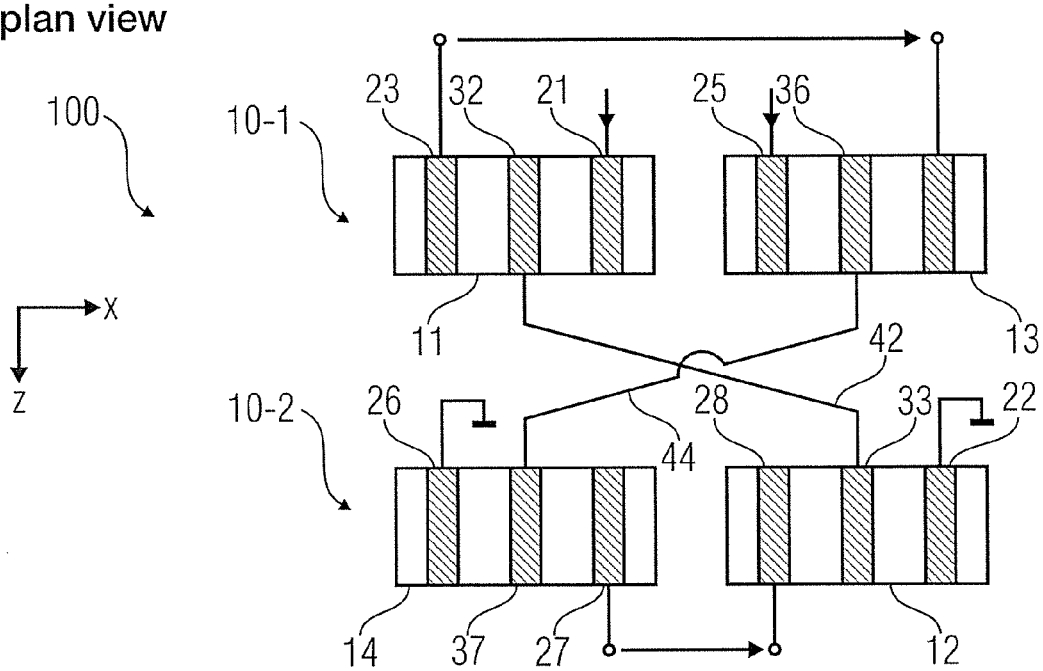
FIG. 15 shows a schematic plan view of an electronic device according to an embodiment with four Hall effect regions arranged in a quadrangle and with diagonal series connections.

The four tubs 11 to 14 may be arranged in a single line as in FIG. 12, yet they may also be arranged in a 2×2-array as shown in FIGS. 13 to 15. The drawings in FIGS. 13 to 15 show the plan views of the various electronic devices in their configurations during operating phase 1; in phase 2 one simply has to exchange momentary supply terminals with momentary sense terminals. All arrangements shown in FIGS. 13 to 15 are substantially equivalent with respect to the Hall signal, yet they are different with respect to thermal-electric and piezoelectric disturbances. These arrangements shown in FIGS. 13 to 15 are generated by mere translations of the tubs from the configuration of FIG. 12—no rotation or mirror symmetric placement has been performed.

There are many ways to arrange the Hall effect regions or tubs 11, 12, 13, and 14 in the layout. For example, they can be arranged along a single line or along a single column. They could also be arranged in an interdigitated way, an interleaved way, or in a quadrangle, where the first basic device 10-1 comprises Hall effect regions in the first and third quadrant (=minor diagonal) and where the second basic device 10-2 is located on the main diagonal (Hall effect regions in the second and fourth quadrant).

It is even possible to rotate one tub of a device against the second tub. Then the first sense contact renders a signal proportional to a first in-plane component of the magnetic field and the second sense contact renders a signal proportional to a second in-plane component of the magnetic field which is rotated by the same amount as the second tub is rotated with respect to the first tub.

Moreover, both tubs of the first device may be positioned parallel to a first direction while the tubs of the second device may be positioned parallel to a second direction. FIGS. 13 to 15 described hereinafter illustrate some possible configurations of the device 100.

FIG. 13 shows a schematic plan view of an electronic device 100 according to an embodiment with four Hall effect regions arranged in a quadrangle. A corresponding cross-section can be readily derived from the schematic plan view of FIG. 13 in an analogous manner as in FIG. 3A. The configuration shown in FIG. 13 may be regarded as a lateral configuration. The first basic electronic device 10-1 comprises two tubs 11, 12 that are arranged on a line. The second basic electronic device 10-2 comprises two further tubs 13, 14 that are arranged on a further line parallel to the line of the first basic electronic device. The tubs 11 and 13 are substantially aligned to each other in a direction perpendicular to the above mentioned line and the further line. Likewise, the tubs 12 and 14 are substantially aligned to each other in the direction perpendicular to the line and the further line. A first differential voltage is tapped between the aligned tubs 11 and 13, in particular the sense contact 23 of the first basic electronic device 10-1 and a sense contact 27 of the second basic electronic device 10-2. A second differential voltage is tapped between the aligned tubs 12 and 14, in particular between the sense contact 24 of the first basic electronic device 10-1 and the sense contact 28 of the second basic electronic device 10-2. The differential voltages are measured in a basic electronic device-spanning manner.

FIG. 14 shows a schematic plan view of an electronic device 100 according to another embodiment with four Hall effect regions arranged in a quadrangle. A corresponding cross-section can be readily derived from the schematic plan view of FIG. 14 in an analogous manner as in FIG. 3A. The configuration shown in FIG. 14 may be regarded as a lateral configuration. The embodiment shown in FIG. 14 is similar to the embodiment shown in FIG. 13 with the following differences: In the second basic electronic device 10-2, the polarity of the supply contacts is inversed and the differential voltages are tapped diagonally between the first tub 11 of the first basic electronic device 10-1 and the second tub 14 of the second basic electronic device 10-2, as well as between the second tub 12 of the first basic electronic device 10-1 and the first tub 13 of the second basic electronic device 10-2. The differential voltages are measured in a basic electronic device-spanning manner.

FIG. 15 shows a schematic plan view of an electronic device 100 according to an embodiment with four Hall effect regions 11 to 14 arranged in a quadrangle and with diagonal interconnection structures. A corresponding cross-section can be readily derived from the schematic plan view of FIG. 15 in an analogous manner as in FIG. 3A. The configuration shown in FIG. 15 may be regarded as a diagonally offset configuration. The first basic electronic device 10-1 forms a diagonal interconnection structure and comprises the upper left tub 11 and the lower right tub 12. The second basic electronic device 10-2 forms another diagonal interconnection structure and comprises the upper right tub 13 and the lower left tub 14. The differential voltages are measured in a basic electronic device-spanning manner. The second Hall effect region 12 is longitudinally and laterally offset with respect to the first Hall effect region 11. Regarding the second basic electronic device 10-2, the Hall effect region 14 is longitudinally and laterally offset with respect to the Hall effect region 13.

According to the basic electronic device 10 having only a single pair of Hall effect regions, the first and second Hall effect regions 11, 12 may be disposed side by side, or laterally offset. Accordingly, the first end of the first Hall effect region and the second end of the second Hall effect region may be adjacent, and vice versa. Typically, the first and second Hall effect regions 11, 12 are elongate and have a longitudinal axis. In a side by side arrangement of the first and second Hall effect regions 11, 12, the second Hall effect region 12 is substantially translated with respect to the first Hall effect region 11 in a direction perpendicular to the longitudinal axis of the first Hall effect region 11 and parallel to the surface thereof.

Figure 16:
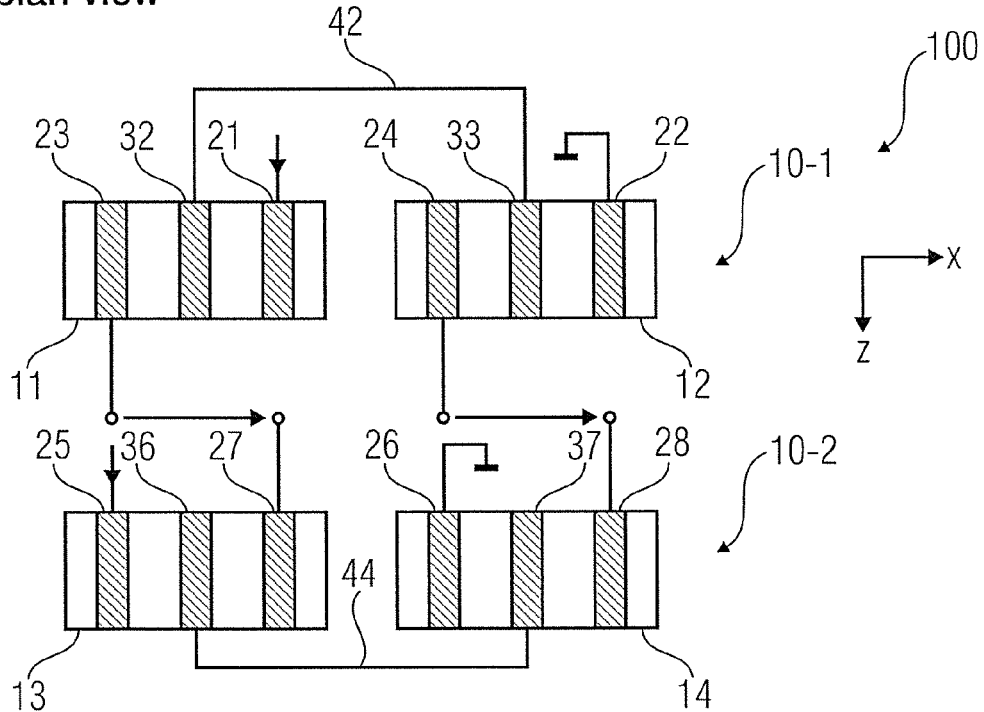
FIG. 16 shows a schematic plan view of an electronic device according to a further embodiment with four Hall effect regions arranged in a quadrangle.

FIG. 16 shows a schematic plan view of an electronic device 100 according to a further embodiment. Depending on whether the two differential voltages are added or subtracted the electronic device 100 is responsive to mechanical stress within the semiconductor crystal in which the Hall effect regions are formed or responsive to a magnetic field. A corresponding cross-section can be readily derived from the schematic plan view of FIG. 16 in an analogous manner as in FIG. 3A. The electronic device 100 comprises two basic electronic devices 10-1, 10-2 having collectively four Hall effect regions 11 to 14 arranged in a quadrangle. This embodiment has some features in common with the embodiment shown in FIG. 10. Note that even when the electronic device 100 is configured to function as a mechanical stress sensor, a magnetic field may influence the electric potentials at the momentary sense contacts due to the Hall effect. However, the Hall effect-related portions of the electric potentials substantially cancel each other out when an output signal is determined on the basis of the electric potentials at the momentary sense contacts. Thus, the magnetic field does not, or only negligibly, influence said output signal. Instead, the output signal is mostly a function of the mechanical stress within the semiconductor crystal. In this manner, the influence of the Hall effect and of a magnetic field in the output signal of a mechanical stress sensor may be reduced. For this reason, the Hall effect regions 11 to 14 which are responsive to a vertical Hall effect have the effect of substantially cancelling out an influence of a magnetic field on the output signal of the mechanical stress sensor. In an analogous manner the influence of a mechanical stress substantially cancels out, when the electronic device 100 is configured to function as a magnetic field sensor, i.e. when the two differential voltages are subtracted from each other.

It is also possible to arrange the four tubs 11 to 14 in a single column and there are also several combinations of sequential order (from top to bottom).

Figure 17:
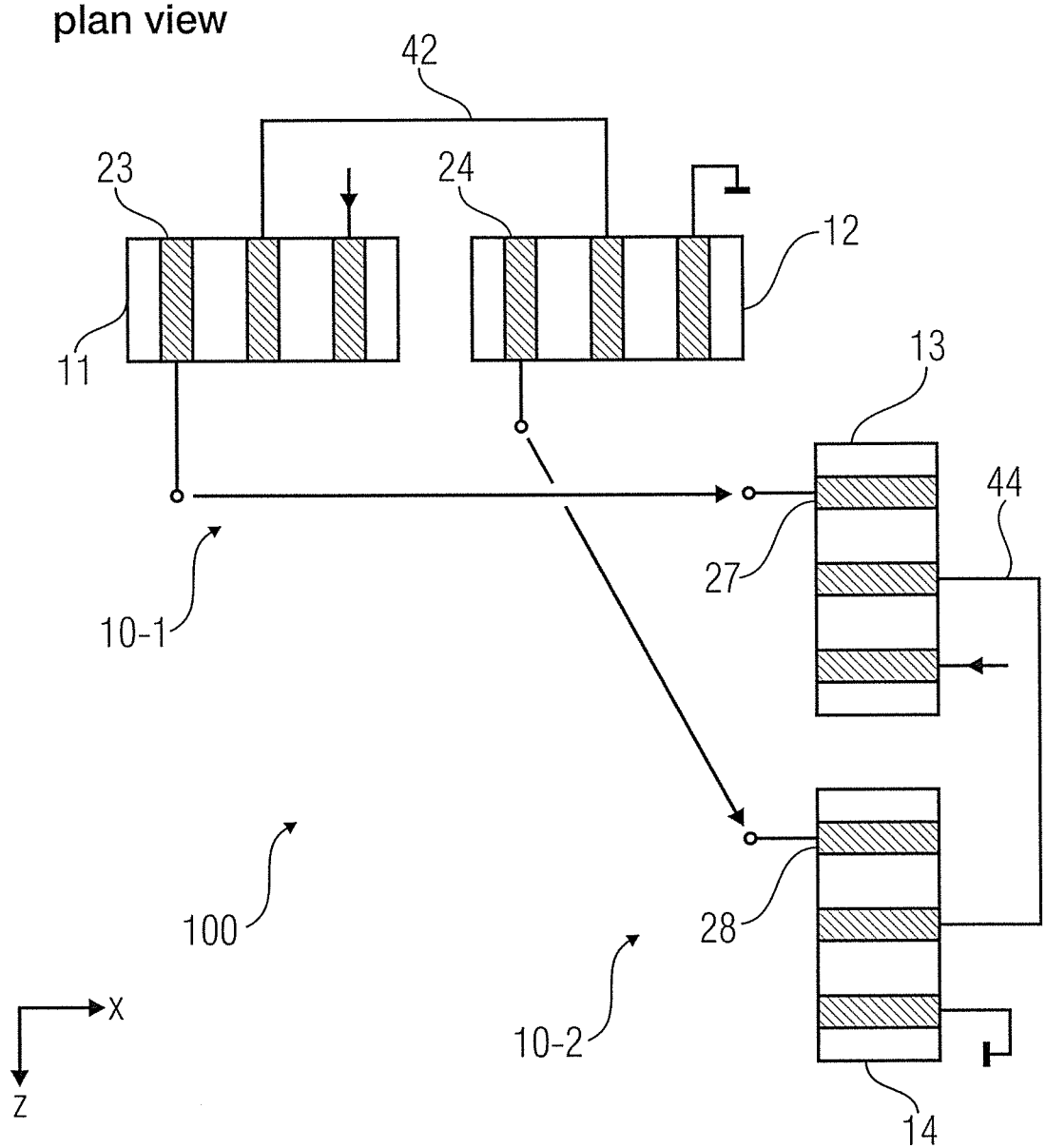
FIG. 17 shows a schematic plan view of an electronic device according to an embodiment with four Hall effect regions, two of which are connected in a first series connection and are arranged at an angle of 90° to the other two Hall effect regions which are connected in a second series connection.

FIG. 17 shows a schematic plan view of an electronic device 10 according to an embodiment with four Hall effect regions 11 to 14. A corresponding cross-section can be readily derived from the schematic plan view of FIG. 17 in an analogous manner as in FIG. 3A. The configuration shown in FIG. 17 may be regarded as an angled configuration. The two Hall effect regions 11 and 12 are arranged on the same line and belong to a first basic electronic device 10-1. The two Hall effect regions 13 and 14 are arranged on another, non-parallel line and belong to a second basic electronic device 10-2. In particular, the Hall effect regions 13, 14 of the second basic electronic 10-2 device are arranged at an angle of 90 degrees (other angles are possible) with respect to the Hall effect regions 11, 12 of the first basic electronic device 10-1. Two differential voltages are measured in a basic electronic device-spanning manner. Typically, the output signals are linear combinations of both magnetic field components parallel to the surface of the die. The coefficients of these linear combinations depend on the angle between the lines along which both basic electronic devices 10-1, 10-2 are arranged. The differential voltage between the sense contacts 23 and 27 is proportional to (Bz−Bx). The other differential voltage between sense contacts 24 and 28 is proportional to (Bx−Bz). Hence, the sum of both differential voltages is independent from the magnetic field. The difference of the differential voltages is proportional to 2*(Bx−Bz) and hence a magnetic field signal.

Figure 18:
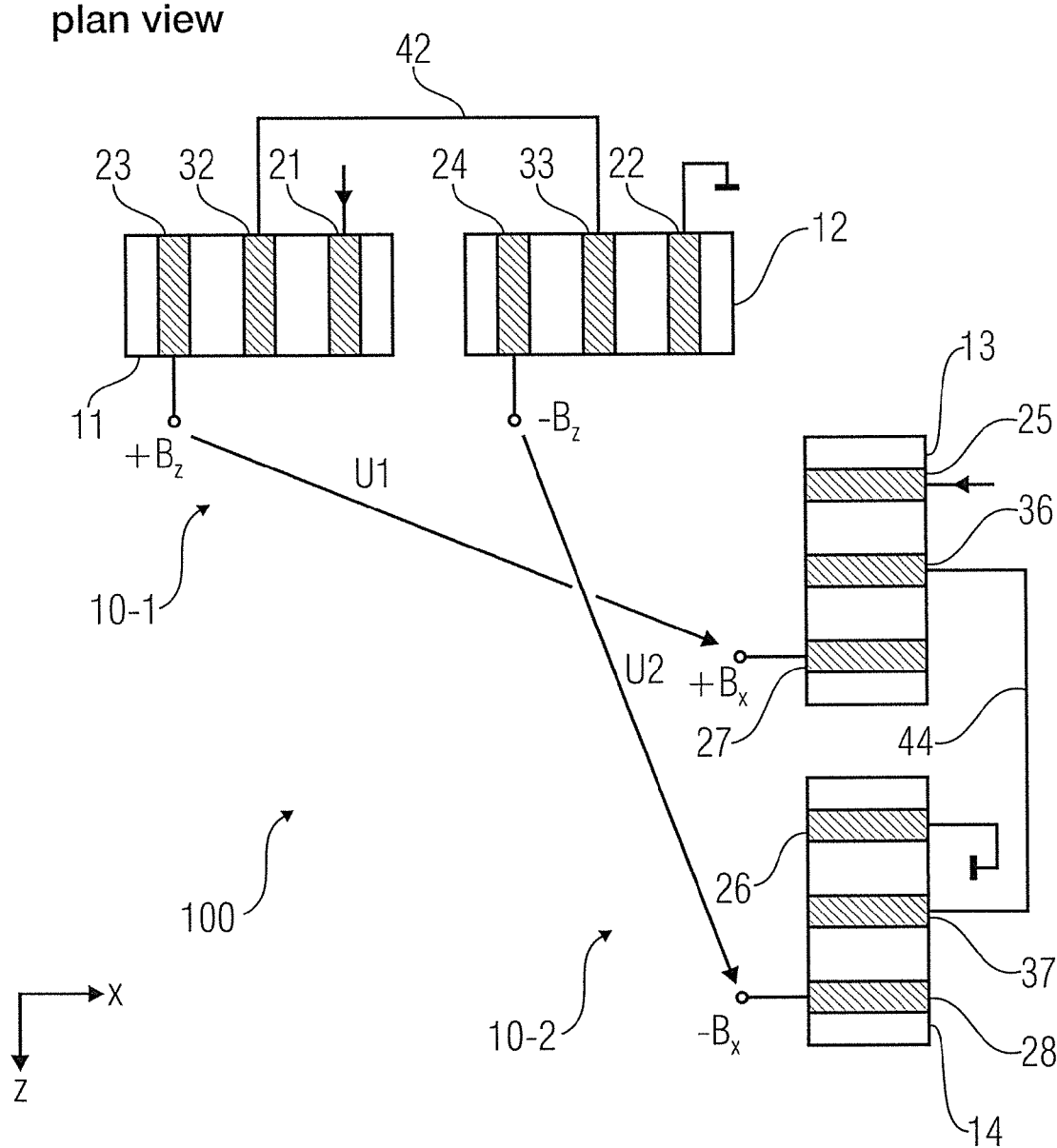
FIG. 18 shows a schematic plan view of an electronic device according to an embodiment with four Hall effect regions similar to the embodiment shown in FIG. 17.

FIG. 18 shows a schematic plan view (top view) of an electronic device 100 according to an embodiment with four Hall effect regions 11 to 14 similar to the embodiment shown in FIG. 17, i.e. an angled configuration. However, the spinning current contacts of the second basic electronic device 10-2 in FIG. 18 have different functions during the first clock phase than in FIG. 17. In particular, the supply contacts in the second basic electronic device 10-2 are, during the first operating phase of the spinning current scheme, the uppermost contacts in the respective Hall effect region 13, 14. A first differential voltage U1 is measured between a momentary sense contact of the first tub 11 of the first basic electronic device 10-1 and a momentary sense contact of the first tub 13 of the second basic electronic device 10-2. A second differential voltage U2 is measured between a sense contact of the second tub 12 of the first basic electronic device 10-1 and a sense contact of the second tub 14 of the second basic electronic device 10-2. The first differential voltage U1 is proportional to −Bx+Bz, i.e. a first linear combination of the magnetic field components in the x-direction and in the z-direction. The second differential voltage U2 is proportional to Bx−Bz, i.e. a second linear combination of the magnetic field components in the x-direction and in the z-direction. Note that U2 is substantially equal to the inverse of U1, i.e., U2=−U1 (when inaccuracies are neglected). A corresponding cross-section can be readily derived from the schematic plan view of FIG. 18 in an analogous manner as in FIG. 3A.

Figure 19:
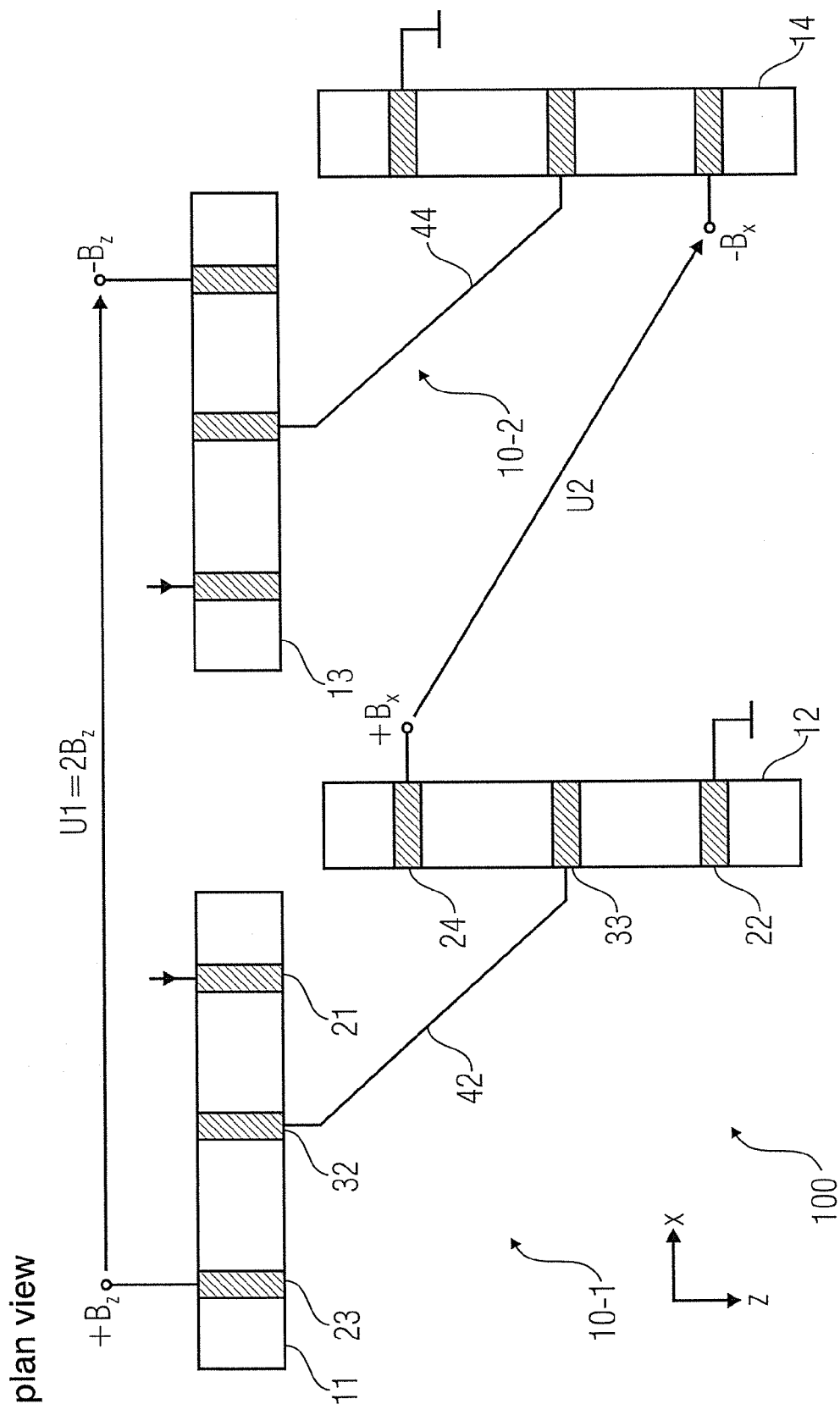
FIG. 19 shows a schematic plan view of an electronic device according to an embodiment, wherein each series connection comprises two Hall effect regions disposed at an angle of 90° to each other.

FIG. 19 shows a schematic top view of an electronic device 100 according to an embodiment, wherein each basic electronic device 10-1, 10-2 comprises two Hall effect regions disposed at an angle of 90 degrees (other angles are possible) to each other. Hence, this embodiment uses an arrangement, where the two tubs of each basic electronic device 10-1, 10-2 are rotated against each other by e.g. 90 degrees in the layout. Two differential voltages U1 and U2 may be measured. In the case depicted in FIG. 19, the first differential voltage U1 is measured between the tub 11 belonging to the first basic electronic device 10-1 and the tub 13 belonging to the second electronic device 10-2. The second differential voltage U2 is measured between the tub 12 belonging to the first basic electronic device 10-1 and the tub 14 belonging to the second basic electronic device 10-2. The first differential voltage U1 is proportional to the term 2Bz. The second differential voltage is proportional to the term 2Bx. A corresponding cross-section can be readily derived from the schematic plan view of FIG. 19 in an analogous manner as in FIG. 3A.

The second basic electronic device 10-2 may also be rotated as a whole against the first basic electronic device 10-1 by some angle: then U2 is not proportional to 2Bx but some linear combination of the magnetic field components Bx and Bz, depending on the exact angular position of the second basic electronic device 10-2 with respect to the first basic electronic device 10-1. Having several arrangements like this at different angular positions, the system can reconstruct Bx and Bz by proper linear combinations of the signals delivered by these systems. For all these arrangements it is possible to shift the position of each tub as a pure translation, in order to arrange them in columns or lines or even in an interdigital arrangement. This may improve matching and reduce errors due to thermo-electric voltages.

Note that the output signals may be in voltage domain (as given in FIGS. 18 and 19, such as U1, U2, . . . )—however, one may also short the sense pins and measure the short circuit currents 11, 12, . . . which carries the same information as the voltage, according to U1=Ri1*I1, U2=Ri2*I2, . . . with Ri1, Ri2 denoting the internal resistances of the devices in the respective electrical configurations. If the current-voltage characteristics of the devices (at zero magnetic field) are linear, U1 and I1 correspond to each other and give the same residual offset over a full spinning current cycle. Yet, if the current-voltage characteristics of the devices are nonlinear, the residual offset of the signals in current domain should typically be more accurate than in voltage domain.

Figure 20:
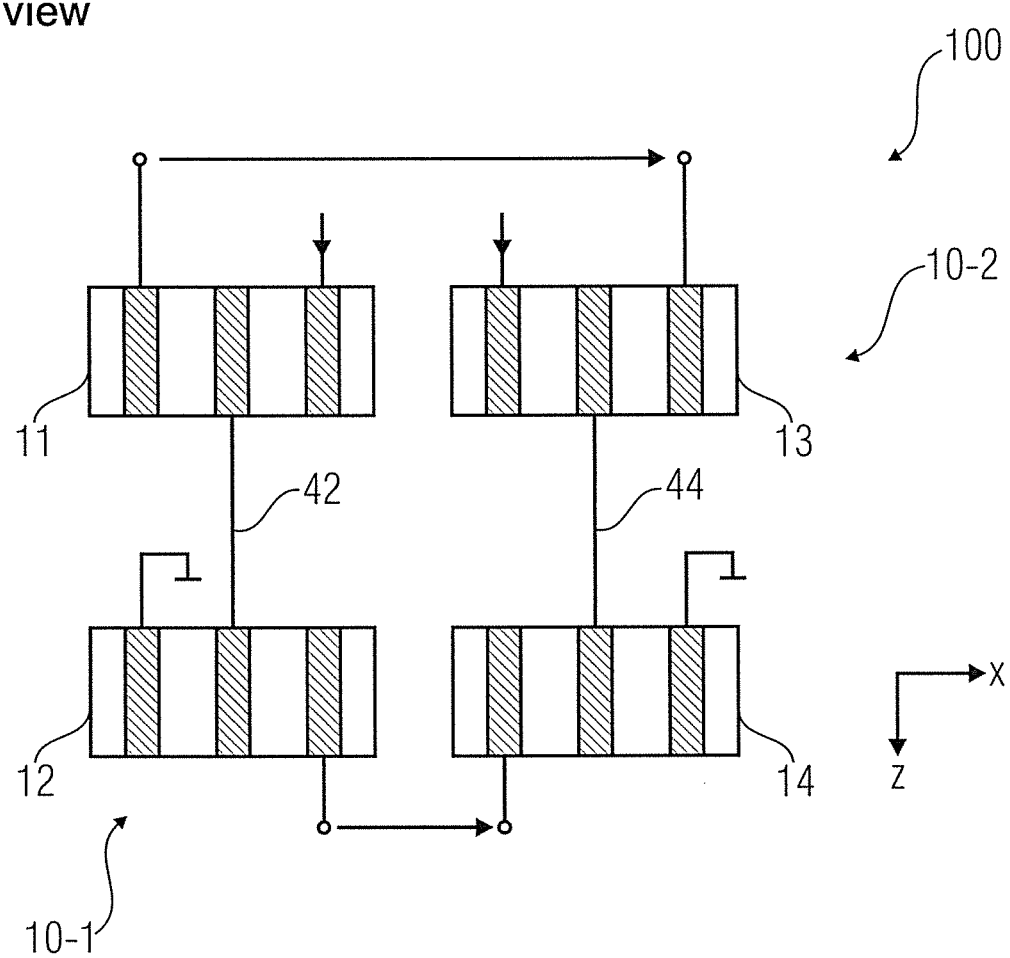
FIG. 20 shows a schematic plan view of an electronic device according to an embodiment similar to the embodiment shown in FIG. 19.

FIG. 20 shows a schematic plan view of an electronic device 10 according to an embodiment comprising four Hall effect regions 11 to 14 arranged in a quadrangle. A corresponding cross-section can be readily derived from the schematic plan view of FIG. 20 in an analogous manner as in FIG. 3A. Regarding the arrangement of the first and second basic electronic devices 10-1, 10-2, the embodiment shown in FIG. 20 has a longitudinal configuration because the right basic electronic device 10-1 is provided in an extension of the longitudinal axis of the left (first) basic electronic device 10-2. A first basic electronic device 10-1 comprises the tubs 11 and 12 which are laterally displaced with respect to each other. A second basic electronic device 10-2 comprises the tubs 13 and 14 which are also laterally displaced with respect to each other. The two basic electronic devices 10-1, 10-2 are arranged on a line extending along a longitudinal direction of the four tubs 11 to 14, i.e. the two basic electronic devices 10-1, 10-2 structures are aligned in the longitudinal direction of the four tubs 11 to 14. The embodiment of FIG. 20 may be briefly described as follows: Both tubs of each basic electronic device 10-1, 10-2 are parallel to each other but on different lines and both basic electronic devices 10-1, 10-2 are next to each other. A more elaborate description of the embodiment shown in FIG. 20 reveals that the electronic device 100 comprises a first Hall effect region 11, a second Hall effect region 12, a third Hall effect region 13, and a fourth Hall effect region 14 that are isolated from each other. Each Hall effect region 11 to 14 comprises a momentary supply contact, a momentary sense contact, and an interconnection contact in or on surfaces of the respective Hall effect region 11 to 14. The interconnection contact 33 of the second Hall effect region 12 is connected to the interconnection contact 32 of the first Hall effect region 11. In a similar manner the interconnection contact 37 of the fourth Hall effect region 14 is connected to the interconnection contact 36 of the third Hall effect region 13. A first differential sense signal is tapped between the sense contacts 23 and 27 of the first and third Hall effect regions 11 and 13, respectively, and a second differential sense signal is tapped between the sense contacts 24 and 28 of the second and fourth Hall effect regions 12 and 14, respectively.

Figure 21:
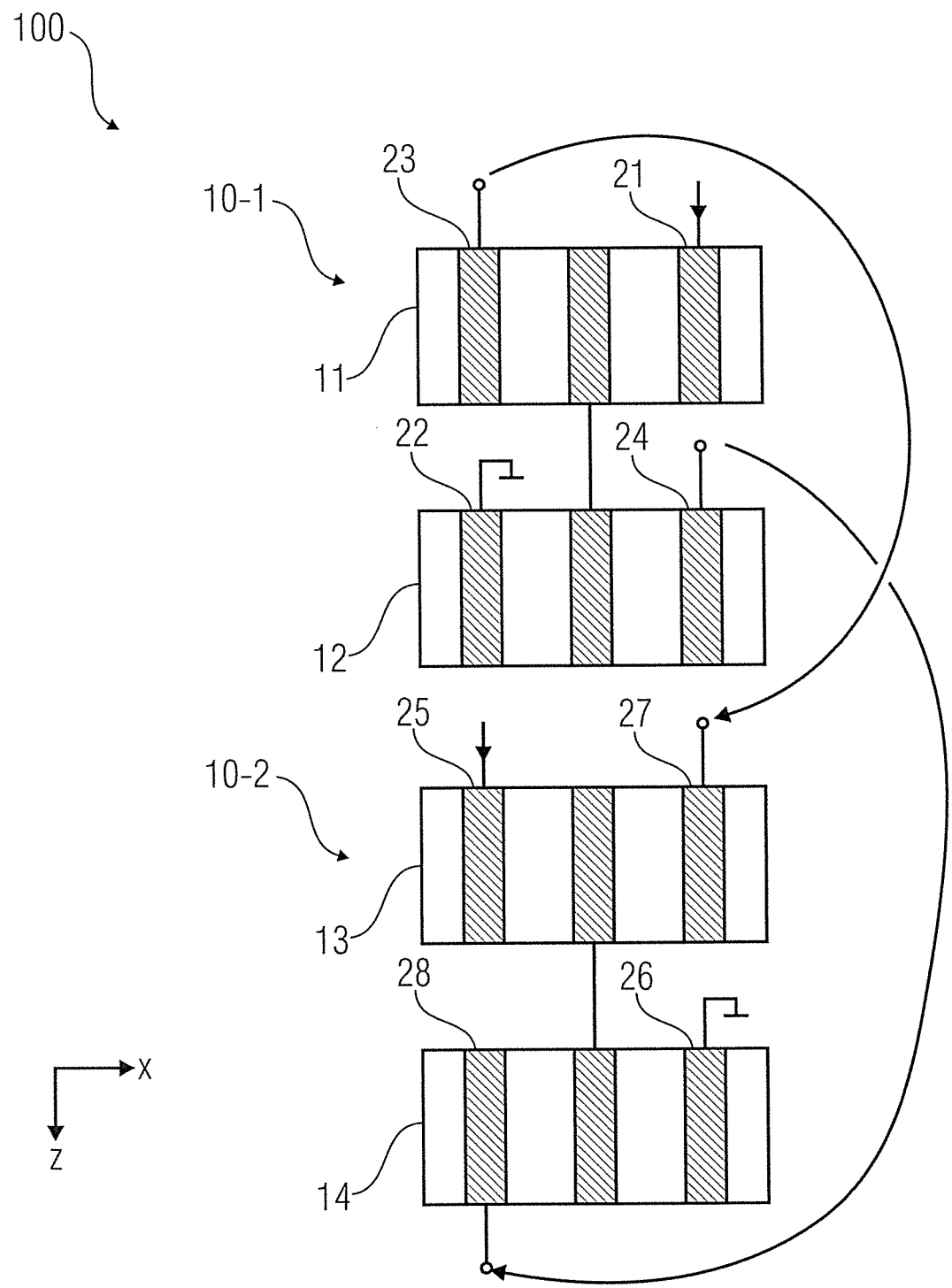
FIG. 21 shows a schematic plan view of an electronic device according to an embodiment comprising four Hall effect regions arranged in a quadrangle.

FIG. 21 shows a schematic plan view of an electronic device 100 according to an embodiment comprising four Hall effect regions 11 to 14 arranged in a column. A corresponding cross-section can be readily derived from the schematic plan view of FIG. 21 in an analogous manner as in FIG. 3A. A first basic electronic device 10-1 comprises the Hall effect regions 11 and 12. A second basic electronic device 10-2 comprises the Hall effect regions 13 and 14. The second basic electronic device 10-2 is arranged laterally displaced with respect to the first basic electronic device 10-1. Two differential signals are tapped in a basic electronic device-spanning manner. The first differential signal is measured between the momentary sense contact 23 at the first tub 11 of the first basic electronic device 10-1 (upper basic electronic device 10-1 in FIG. 21) and the sense contact 27 at the first tub 13 of the second basic electronic device 10-2 (lower basic electronic device in FIG. 21). The second differential signal is measured between the sense contact 24 at the second tub 12 of the first basic electronic device 10-1 and the sense contact 28 of the second tub of the second basic electronic device 10-2.

Figure 22:
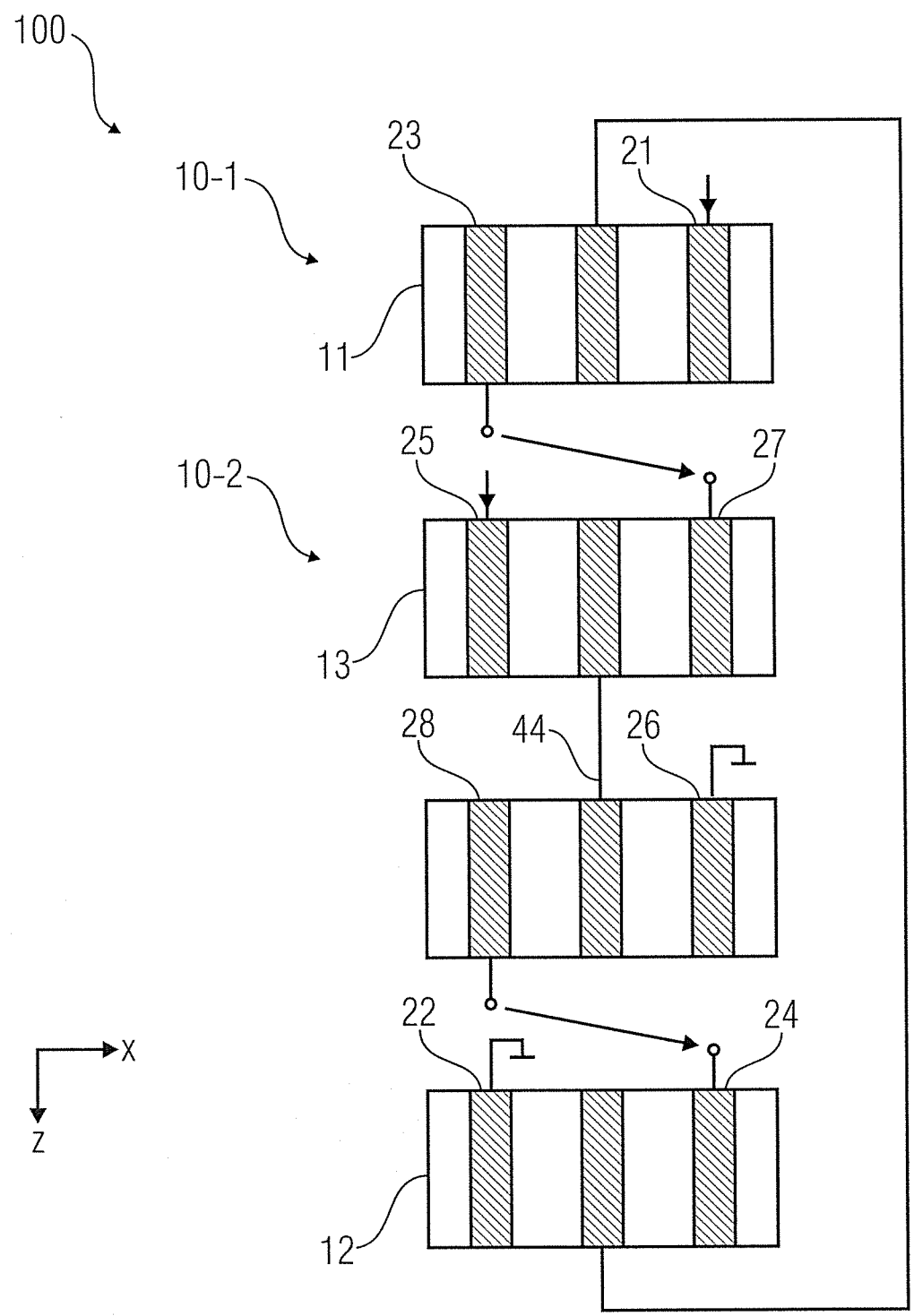
FIG. 22 shows a schematic plan view of an electronic device according to an embodiment similar to the one shown in FIG. 18.

FIG. 22 shows a schematic plan view of an electronic device 100 according to another embodiment comprising four Hall effect regions arranged in a column wherein the basic electronic device 10-1, 10-2 are interleaved or concentric with respect to each other, i.e. a concentric configuration. A corresponding cross-section can be readily derived from the schematic plan view of FIG. 22 in an analogous manner as in FIG. 3A. A first basic electronic device 10-1 comprises the tubs 11 and 12 and a second basic electronic device 10-2 comprises the tubs 13 and 14. The first basic electronic device 10-1 is an outer device which surrounds the inner, second basic electronic device 10-2. A first differential signal is measured between a momentary sense contact 23 at the first tub 11 of the outer, first basic electronic device 10-1 and the sense contact 27 at the first tub 13 of the inner, second basic electronic device 10-2. The second differential signal is measured between the momentary sense contact 24 at the second tub 12 of the outer, first basic electronic device 10-1 and the sense contact 28 of the second tub of the inner, second basic electronic device 10-2.

Figure 23:
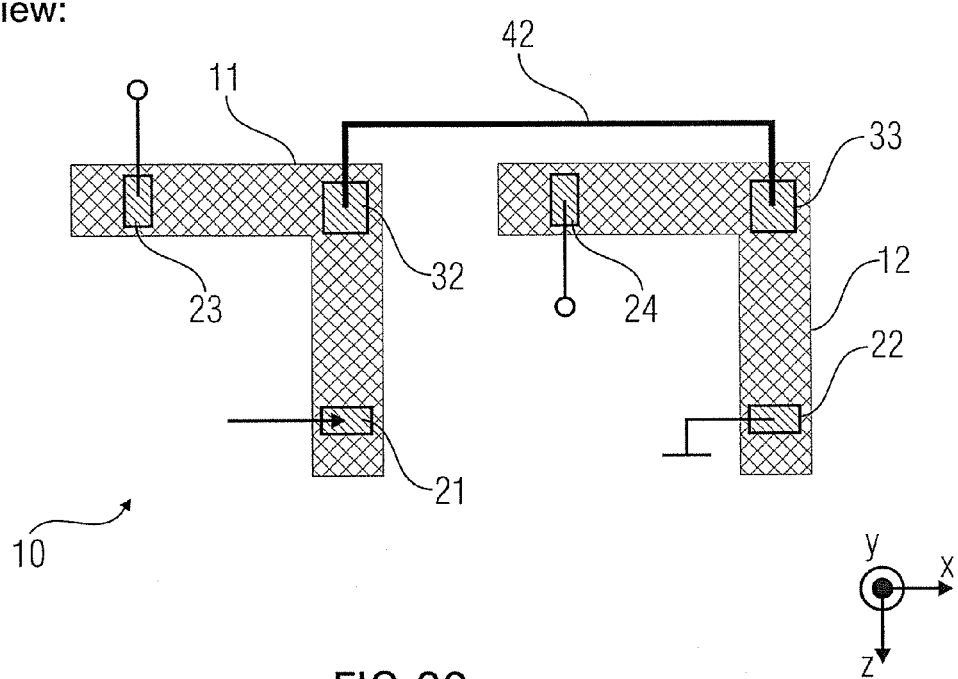
FIG. 23 shows a schematic plan view of an electronic device according to an embodiment in which the Hall effect regions are L-shaped.

FIG. 23 shows a schematic plan view of an electronic device 10 according to yet another possible embodiment of the teachings disclosed herein. The Hall effect regions 11 and 12 are L-shaped and the interconnection contacts 32 and 33 are located in the corner of the L-shaped first Hall effect region 11 and second Hall effect region 12, respectively. The interconnection contact 32 is in the symmetry center of the first contact 21 and the third contact 23. A distance between the first contact 21 and the interconnection contact (second contact) 32 is substantially equal to a distance between the second contact 32 and the third contact 23. Likewise, the interconnection contact 33 is in the symmetry center of the first contact 22 and the third contact 24, and the distance between the first contact 22 and the interconnection contact (second contact) 33 is substantially equal to a distance between the second contact 33 and the third contact 24.

Figure 24:
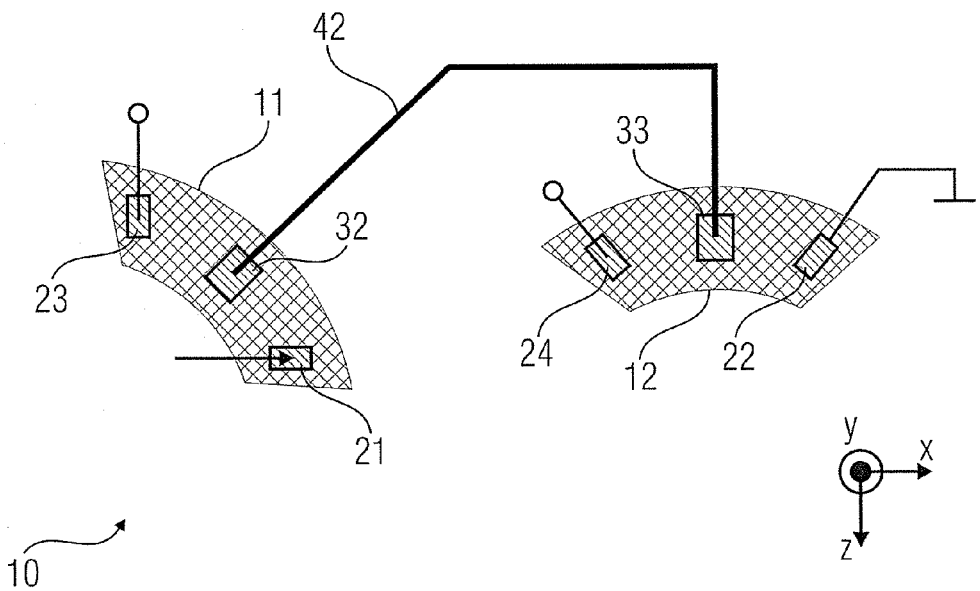
FIG. 24 shows a schematic plan view of an electronic device according to an embodiment in which the Hall effect regions are arc-shaped.

FIG. 24 shows a schematic plan view of an electronic device 10 according to a further embodiment of the teachings disclosed herein. The Hall effect regions 11 and 12 are arc-shaped. Reference is made to the comments made above in the context of the description of FIG. 23 regarding the contacts 21, 32, 22 and 22, 33, 24. The arc-shaped Hall effect regions 11, 12 may extend over an arbitrary angle, such as 45 degrees, 60 degrees, 90 degrees, 120 degrees.

Figure 25:
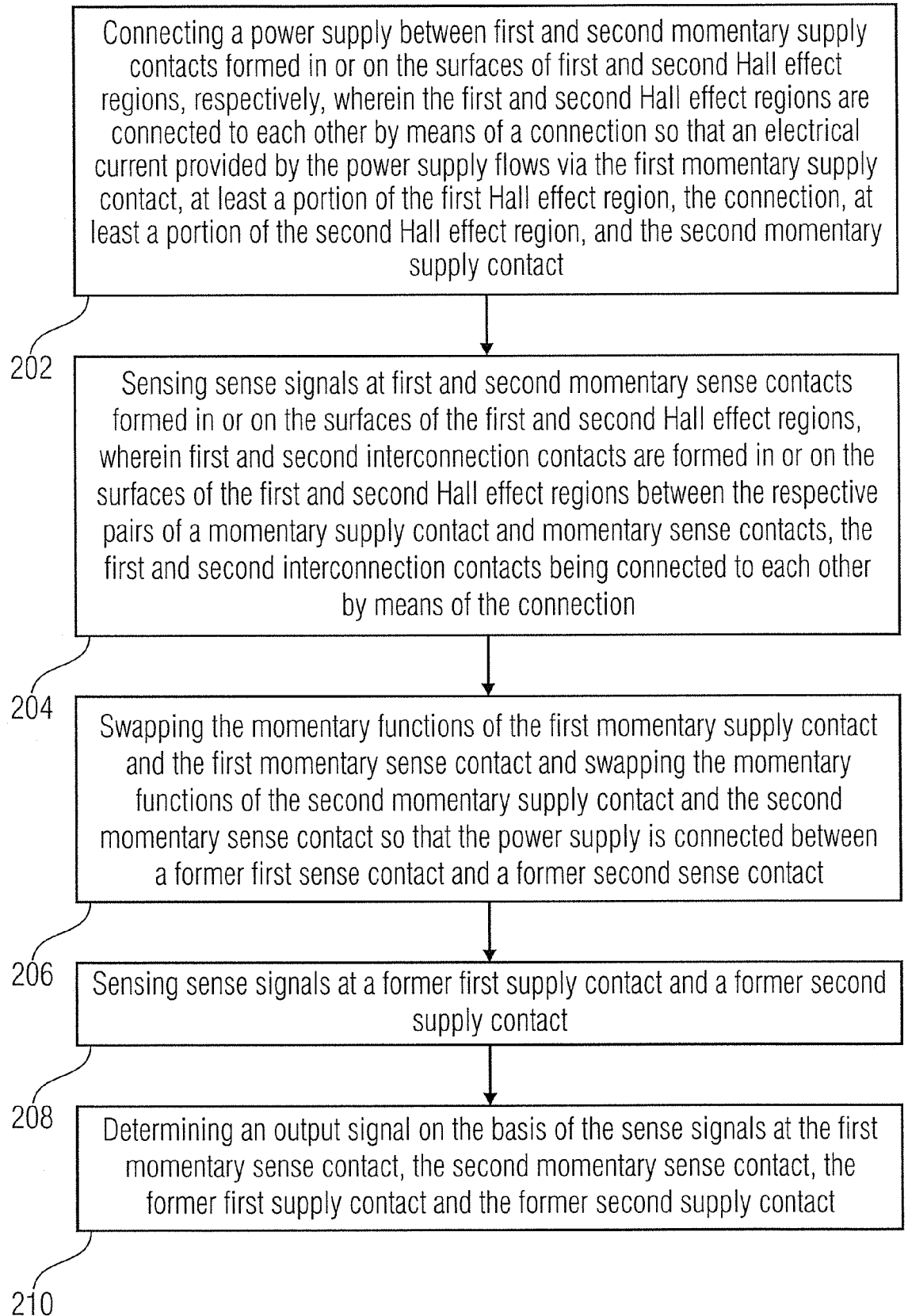
FIG. 25 shows a schematic flow diagram of a method for sensing a physical quantity according to the teachings disclosed herein.

FIG. 25 shows a schematic flow diagram of a sensing method for a physical quantity. At a step 202 a power supply is connected between a first momentary supply contact formed in or on the surface of a first Hall effect region and a second momentary supply contact formed in or on the surface of a second Hall effect region. The first Hall effect region and the second Hall effect region are connected to each other by means of a connection so that an electrical current provided by the power supply flows via the first momentary supply contact, at least a portion of the first Hall effect region, the connection, at least a portion of the second Hall effect region, and the second momentary supply contact back to the power supply.

Sense signals are then sensed at a first momentary sense contact formed in or on the surface of the first Hall effect region and at a second momentary sense contact formed in or on a surface of the second Hall effect region (step 204). A first interconnection contact is formed in or on the surface of the first Hall effect region between the first momentary supply contact and the first momentary sense contact. A second interconnection contact is formed in or on the surface of the second Hall effect region between the second momentary supply contact and the second momentary sense contact. The first and second interconnection contacts are connected to each other by means of the connection.

At a step 206 the momentary functions of the first momentary supply contact and of the first momentary sense contact are swapped. Furthermore, the momentary functions of the second momentary supply contact and of the second momentary sense contact are swapped so that the power supply is connected between a former first sense contact and a former second sense contact.

At a step 208 sense signals at a former first supply contact and a former second supply contact are sensed. An output signal is then determined during a step 210 on the basis of the sense signals at the first momentary sense contact, the second momentary sense contact, the former first supply contact and the former second supply contact.

The sensing method may be extended when the electronic device comprises a first basic electronic device 10-1 and a second basic electronic device 10-2, as depicted, for example, in FIGS. 9A to 22. The first Hall effect region and the second Hall effect region, their corresponding contacts and the connection form the first electronic device 10-1. A third Hall effect region, a fourth Hall effect region, corresponding contacts and a second connection form a second electronic device similar 10-2 to the first electronic device. According to an embodiment of the teachings disclosed herein, the extended sensing method may further comprise connecting the power supply or another power supply between a first momentary supply contact and a second momentary supply contact of the second electronic device. A sense signal may then be sensed at a first momentary sense contact of the second electronic device. Subsequently, the function of the first momentary sense contact of the second electronic device and the first momentary supply contact of the second electronic device are swapped so that the electrical current is provided via a former sense contact of the second electronic device. The method then continues with sensing a sense signal at a former first supply contact of the second electronic device. The determination of the output signal further takes into account the sense signals at the first momentary sense contact of the second electronic device and at the former first supply contact of the second electronic device.

It is also possible that a differential signal is determined as a difference between the sense signals at the first momentary sense contact of the first electronic device and the first momentary sense contact of the second electronic device. A second differential signal may be determined as a difference between the sense signals at the former first supply contact of the first electronic device and the former first supply contact of the second electronic device. Finally, the output signal may be determined on the basis of the first differential signal and the second differential signal.

The sensing method may be a magnetic sensing method for sensing a magnetic field using the Hall effect.

Alternatively, the sensing method may be a mechanical stress sensing method, wherein directions of an electrical current flow within the first and second Hall effect regions are chosen so that a Hall effect occurring in the first Hall effect region and a Hall effect occurring in the second Hall effect region are responsible for substantially canceling an influence of a magnetic field on the output signal when the output signal is determined by means of a linear combination of the sense signals observed at the momentary sense contacts of the first Hall effect region and the second Hall effect region. The cancellation of the influence of the magnetic field works particularly well if the magnetic field is substantially equal in the various Hall effect regions.

Figure 26:
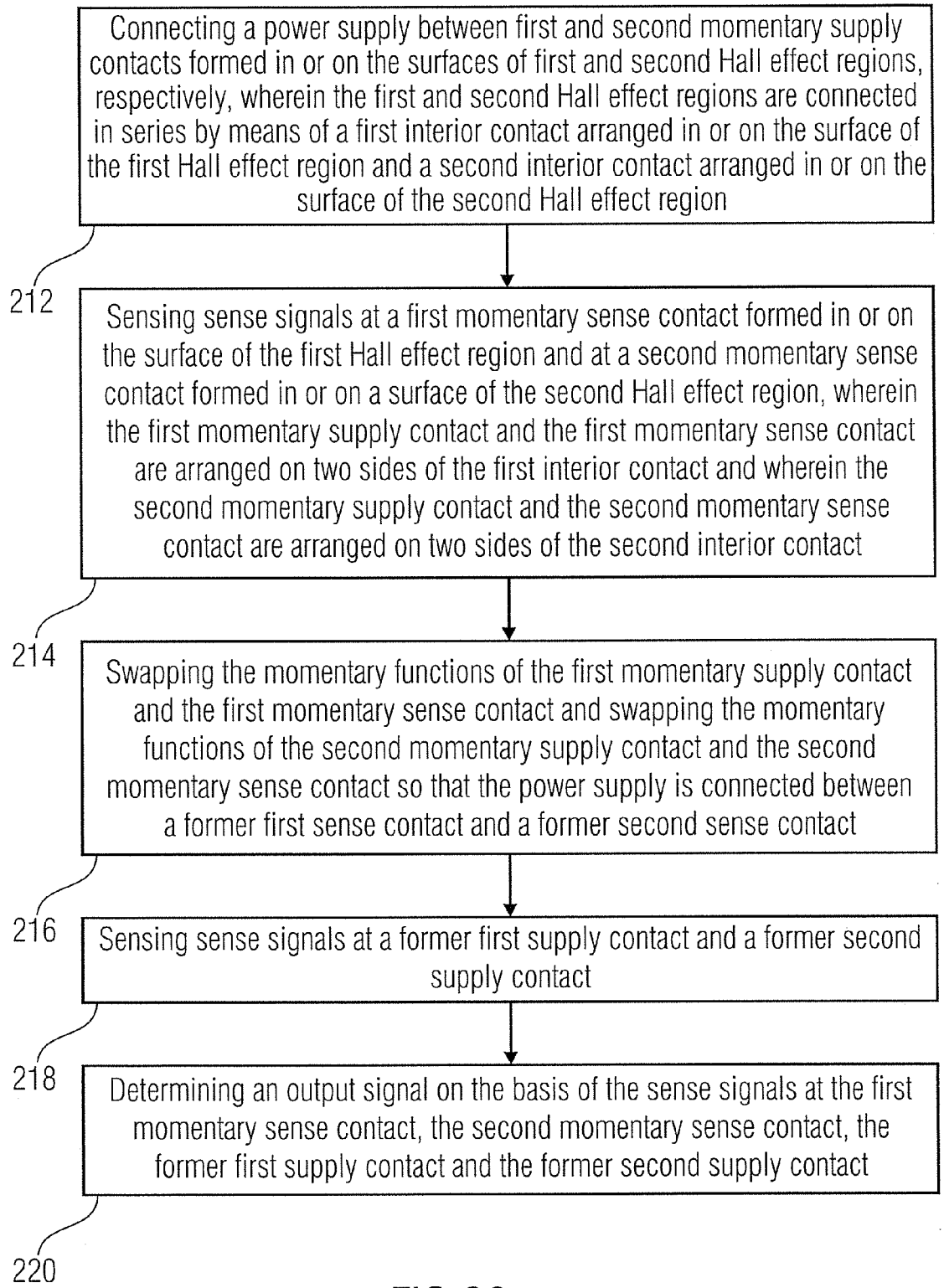
FIG. 26 shows a schematic flow diagram of a method for sensing a physical quantity according to another embodiment of the teachings disclosed herein.

FIG. 26 shows a schematic flow diagram of another sensing method according to an embodiment of the teachings disclosed herein. At a step 212 a power supply is connected between a first momentary supply contact formed in or on the surface of a first Hall effect region and a second momentary supply contact formed in or on the surface of a second Hall effect region. The first Hall effect region and the second Hall effect region are connected in series by means of a first interior contact arranged in or on the surface of the first Hall effect region and a second interior contact arranged in or on the surface of the second Hall effect region.

At a step 214 sense signals are acquired at a first momentary sense contact formed in or on the surface of the first Hall effect region and at a second momentary sense contact formed in or on a surface of the second Hall effect region. The first momentary supply contact and the first momentary sense contact are arranged on two sides of the first interior contact and wherein the second momentary supply contact and the second momentary sense contact are arranged on two sides of the second interior contact.

The momentary functions of the first momentary supply contact and the first momentary sense contact are swapped during a step 216. The momentary functions of the second momentary supply contact and the second momentary sense contact are also swapped during the step 216 so that the power supply is connected between a former first sense contact and a former second sense contact.

At a step 218, sense signals are acquired at a former first supply contact and a former second supply contact. An output signal is then determined at a step 220 on the basis of the sense signals at the first momentary sense contact, the second momentary sense contact, the former first supply contact and the former second supply contact.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

The invention claimed is:
1. An electronic device comprising:
   a Hall effect region;
   a first contact arranged in or on a surface of the Hall effect region, and configured to function at least temporarily as a first supply contact for the Hall effect region;
   a second contact arranged in or on the surface of the Hall effect region, the second contact being a second supply contact for the Hall effect region; and
   a third contact arranged in or on the surface of the Hall effect region, and configured to function at least temporarily as a sense contact;
   wherein an electrical current distribution within the Hall effect region is influenced by a physical quantity to be measured, and wherein a sense signal tapped at the third contact is a function of the current distribution, the sense signal thus being indicative of the physical quantity.
2. The electronic device of claim 1, wherein the Hall effect region is a first Hall effect region;

wherein the first contact and the third contact form a first pair of contacts that are configured to alternately function as a first momentary supply contact and a first momentary sense contact arranged in or on a surface of the first Hall effect region;

wherein the second contact is a first interconnection contact arranged in or on the surface of the first Hall effect region;

the electronic device further comprising:

a second Hall effect region;

a second pair of contacts that are configured to alternately function as a second momentary supply contact and a second momentary sense contact arranged in or on a surface of the second Hall effect region;

a second interconnection contact arranged in or on the surface of the second Hall effect region; and a connection configured to connect the first interconnection contact and the second interconnection contact;

wherein a sense signal tapped at at least one of the first momentary sense contact and the second momentary sense contact is a function of the current distribution, the sense signal thus being indicative of the physical quantity.

3. The electronic device according to claim 2, wherein the first interconnection contact is arranged between the first pair of contacts and wherein the second interconnection contact is arranged between the second pair of contacts.

4. The electronic device according to claim 2, wherein the first interconnection contact is arranged between the first momentary supply contact and the first momentary sense contact so that a spacing between the first momentary supply contact and the first interconnection contact is substantially equal to a spacing between the first interconnection contact and the first momentary sense contact; and wherein the second interconnection contact is arranged between the momentary second supply contact and the momentary sense contact so that a spacing between the second momentary supply contact and the second interconnection contact is substantially equal to a spacing between the second interconnection contact and the second momentary sense contact.

5. The electronic device according to claim 4, wherein the first pair of contacts and the first interconnection contact are substantially arranged along a line in or on the surface of the first Hall effect region; and wherein the second pair of contacts and the second interconnection contact are substantially arranged along a line in or on the surface of the second Hall effect region.

6. The electronic device according to claim 2, wherein at least one of the first pair of contacts and the second pair of contacts is configured for utilization in a spinning current scheme with at least two clock phases, where all sense contacts of a first clock phase are used as supply contacts in a second clock phase and all supply contacts of a first clock phase are used as sense contacts in a second clock phase, and the sense signals of both clock phases are combined to give a total signal that is indicative of the physical quantity.

7. The electronic device according to claim 2, further comprising a third Hall effect region;

a third pair of contacts that are configured to alternately function as a third momentary supply contact and a third momentary sense contact arranged in or on a surface of the third Hall effect region;

a third interconnection contact arranged in or on the surface of the third Hall effect region;

a fourth Hall effect region;

a fourth pair of contacts that are configured to alternately function as a fourth momentary supply contact and a fourth momentary sense contact arranged in or on a surface of the fourth Hall effect region;

a fourth interconnection contact arranged in or on the surface of the second Hall effect region; and a further connection configured to connect the third interconnection contact and the fourth interconnection contact so that a further electrical current supplied to the electronic device via the third momentary supply contact and leaving the electronic device via the fourth momentary contact is conducted via the further connection from the third Hall effect region to the fourth Hall effect region.

8. The electronic device according to claim 7, further comprising a first signal extraction circuit configured to provide a first signal on the basis of a first sense signal and a third sense signal, the first sense signal being tapped at the first momentary sense contact and the third sense signal being tapped at the third momentary sense contact; and a second signal extraction circuit configured to provide a second signal on the basis of a second sense signal and a fourth sense signal, the second sense signal being tapped at the second momentary contact and the fourth sense signal being tapped at the fourth momentary sense contact.

9. The electronic device according to claim 7, wherein the first interconnection contact is located between the first momentary supply contact and the first momentary sense contact;

wherein the third interconnection contact is located between the third momentary supply contact and the third momentary sense contact, the third momentary supply contact and the third momentary sense contact being arranged with respect to the third interconnection contact in a mirrored manner compared to the arrangement of the first momentary supply contact and the first momentary sense contact with respect to the first interconnection contact;

wherein the second interconnection contact is located between the second momentary supply contact and the second momentary sense contact; and wherein the fourth interconnection contact is located between the fourth momentary supply contact and the fourth momentary sense contact, the fourth momentary supply contact and the fourth momentary sense contact being arranged with respect to the fourth interconnection contact in a mirrored manner compared to the arrangement of the second momentary supply contact and the second momentary sense contact with respect to the second interconnection contact.

10. The electronic device according to claim 7, wherein the first interconnection contact is located between the first momentary supply contact and the first momentary sense contact;

wherein the third interconnection contact is located between the third momentary supply contact and the third momentary sense contact in an arrangement substantially alike to the arrangement of the first momentary supply contact and the first momentary sense contact with respect to the first interconnection contact;

wherein the second interconnection contact is located between the second momentary supply contact and the second momentary sense contact; and wherein the fourth interconnection contact is located between the fourth momentary supply contact and the fourth momentary sense contact in an arrangement substantially alike to the arrangement of the second momentary supply contact and the second momentary sense contact with respect to the second interconnection contact.

11. The electronic device according to claim 7, further comprising a feedback circuit selectively connected to the first momentary sense contact and the third momentary sense contact, the feedback circuit being configured to add an electrical current at one of its input terminals to make the electrical potentials at both input terminals substantially identical.

12. The electronic device according to claim 7, wherein the first Hall effect region, the second Hall effect region, the third Hall effect region, and the fourth Hall effect region are arranged along a single line, along a single column, in an interdigitated manner, or in an interleaved manner.

13. The electronic device according to claim 7, wherein the first Hall effect region, the second Hall effect region, the third Hall effect region, and the fourth Hall effect region are arranged in a quadrangle, wherein the first Hall effect region and the second Hall effect region are arranged in a first quadrant and a third quadrant, respectively, and wherein the third Hall effect region and the fourth Hall effect region are located in a second quadrant and a fourth quadrant, respectively.

14. The electronic device according to claim 7, wherein the first Hall effect region and the second Hall effect region are arranged along a first direction and wherein the third Hall effect region and the fourth Hall effect region are arranged along a second direction defining a non-zero angle with the first direction.

15. The electronic device according to claim 7, further comprising a sense signal evaluator configured to be connected to the momentary sense contact of the first pair of contacts and to the momentary sense contact of the third pair of contacts, and further configured to process a differential sense signal that is based on both sense signals provided at the first momentary sense contact and the third momentary sense contact.

16. The electronic device according to claim 2, further comprising a current sensing device connectable to one or both of the first momentary sense contact and the second momentary sense contact and wherein the electrical current sensed by the current sense device represents the signal between the first momentary sense contact and the second momentary sense contact, a variation of which is indicative of the magnitude of a variation of the physical quantity.

17. The electronic device according to claim 2, wherein the first Hall effect region and the second Hall effect region are disposed at a non-zero angle to each other.

18. The electronic device according to claim 2, wherein the electronic device is a Hall effect device sensitive to a magnetic field parallel to the surfaces of the first Hall effect region and the second Hall effect region and substantially perpendicular to a current flow direction of the electrical current within at least one of the first Hall effect region and the second Hall effect region.

19. The electronic device according to claim 2, wherein the electronic device is a mechanical stress sensor, and wherein the momentary sense contacts of the first and second pairs of the contacts are arranged relative to the momentary supply contacts of the first and second pairs of contacts in a manner that an electrical current within the first Hall effect region passing by the first momentary sense contact has substantially the same direction as an electrical current within the second Hall effect region passing by the second momentary sense contact, whereby the mechanical stress sensor is sensitive to a mechanical stress within at least one of the first Hall effect region and the second Hall effect region.

20. The electronic device according to claim 2, wherein, with respect to contacts of the first and second Hall effect regions, the first Hall effect region comprises just the first pair of contacts and the first interconnection contact, and wherein the second Hall effect region comprises just the second pair of contacts and the second interconnection contact.

21. The electronic device according to claim 2, wherein the first interconnection contact is connected to the second interconnection contact of the second group so that the first Hall effect region and the second Hall effect region are connected in series with respect to the first momentary supply contact and the second momentary supply contact.

22. The electronic device according to claim 2, wherein the first contact and the third contact are arranged in a substantially symmetrical manner to each other with respect to the second contact.

23. An electronic device comprising:
a Hall effect region;
a first contact arranged in or on a surface of the Hall effect region and configured to at least temporarily function as a supply contact;
a second contact arranged in or on the surface of the Hall effect region and configured to function as a further supply contact; and
a third contact arranged in or on the surface of the Hall effect region configured to at least temporarily function as a sense contact; and
wherein an electrical current distribution within the Hall effect region is influenced by a physical quantity to be measured and wherein a sense signal tapped at the third contact is a function of the current distribution, the sense signal thus being indicative of the physical quantity;
wherein the Hall effect region is a first Hall effect region;
wherein the first contact and the third contact form a first pair of contacts that are configured to alternately function as a first momentary supply contact and a first momentary sense contact arranged in or on a surface of the first Hall effect region;
wherein the second contact is a first interconnection contact arranged in or on the surface of the first Hall effect region;
the electronic device further comprising:
a second Hall effect region;
a second pair of contacts that are configured to alternately function as a second momentary supply contact and a second momentary sense contact arranged in or on a surface of the second Hall effect region;
a second interconnection contact arranged in or on the surface of the second Hall effect region; and
a connection configured to connect the first interconnection contact and the second interconnection contact;
wherein a sense signal tapped at at least one of the first momentary sense contact and the second momentary sense contact is a function of the current distribution, the sense signal thus being indicative of the physical quantity.

24. The electronic device according to claim 23, wherein the third contact being at a first distance from the first contact and at a second distance from the second contact, and wherein a distance between the first contact and the second contact is smaller than a maximum of the first distance and the second distance.

\* \* \* \* \*